(12) United States Patent
Zarabadi et al.

(10) Patent No.: US 12,464,690 B2
(45) Date of Patent: Nov. 4, 2025

(54) SYSTEMS AND METHODS FOR ADAPTIVE GATE DRIVER FOR INVERTER FOR ELECTRIC VEHICLE

(71) Applicant: BorgWarner US Technologies LLC, Wilmington, DE (US)

(72) Inventors: Seyed R. Zarabadi, Kokomo, IN (US); Mark Wendell Gose, Kokomo, IN (US); Peter Allan Laubenstein, Sharpsville, IN (US)

(73) Assignee: BorgWarner US Technologies LLC, Wilmington, DE (US)

( * ) Notice: Subject to any disclaimer, the term of this patent is extended or adjusted under 35 U.S.C. 154(b) by 487 days.

(21) Appl. No.: 18/152,910

(22) Filed: Jan. 11, 2023

(65) Prior Publication Data
US 2024/0106319 A1 Mar. 28, 2024

Related U.S. Application Data

(60) Provisional application No. 63/378,601, filed on Oct. 6, 2022, provisional application No. 63/377,486, filed
(Continued)

(51) Int. Cl.
*H02M 7/53* (2006.01)
*B60L 3/00* (2019.01)
(Continued)

(52) U.S. Cl.
CPC ........... *H02M 7/5387* (2013.01); *B60L 3/003* (2013.01); *B60L 15/007* (2013.01); *B60L 15/08* (2013.01);
(Continued)

(58) Field of Classification Search
CPC .. H02M 7/5387; H02M 1/327; H02M 1/0054; H02M 1/322; H02M 1/123;
(Continued)

(56) References Cited

U.S. PATENT DOCUMENTS

| 4,054,828 A | 10/1977 | Conzelmann et al. |
| 4,128,801 A | 12/1978 | Gansert et al. |

(Continued)

FOREIGN PATENT DOCUMENTS

| EP | 3261254 A1 | 12/2017 |
| JP | 2008092663 A | 4/2008 |

(Continued)

OTHER PUBLICATIONS

Maniar, K., et al., "Addressing High-voltage Design Challenges With Reliable and Affordable Isolation Technologies," 2024, pp. 1-12. Retrieved from internet URL: https://www.ti.com/lit/wp/slyy204c/slyy204c.pdf ts=1710508127616&ref_url=https%253A%252F%252Fwww.google.com%252F.

(Continued)

*Primary Examiner* — Rafael O De Leon Domenech
(74) *Attorney, Agent, or Firm* — Joshua M. Haines; Bookoff McAndrews, PLLC

(57) ABSTRACT

A system comprises: an inverter configured to convert DC power from a battery to AC power to drive a motor, wherein the inverter includes: a power switch including a drain terminal, a source terminal, and a gate terminal; a gate driver configured to provide a signal to the gate terminal, the gate driver including one or more of a resistive gate driver with variable resistance or a current gate driver with variable current; and one or more controllers configured to detect a voltage from the gate terminal to the source terminal of the power switch, and control the gate driver based on the detected voltage.

20 Claims, 13 Drawing Sheets

Related U.S. Application Data on Sep. 28, 2022, provisional application No. 63/377,512, filed on Sep. 28, 2022, provisional application No. 63/377,501, filed on Sep. 28, 2022.

(51) Int. Cl.

| | | |
|---|---|---|
| *B60L 15/00* | (2006.01) | |
| *B60L 15/08* | (2006.01) | |
| *B60L 50/40* | (2019.01) | |
| *B60L 50/51* | (2019.01) | |
| *B60L 50/60* | (2019.01) | |
| *B60L 50/64* | (2019.01) | |
| *B60L 53/20* | (2019.01) | |
| *B60L 53/22* | (2019.01) | |
| *B60L 53/62* | (2019.01) | |
| *B60R 16/02* | (2006.01) | |
| *G01R 15/20* | (2006.01) | |
| *G06F 1/08* | (2006.01) | |
| *G06F 13/40* | (2006.01) | |
| *H01L 21/48* | (2006.01) | |
| *H01L 23/00* | (2006.01) | |
| *H01L 23/15* | (2006.01) | |
| *H01L 23/367* | (2006.01) | |
| *H01L 23/373* | (2006.01) | |
| *H01L 23/40* | (2006.01) | |
| *H01L 23/467* | (2006.01) | |
| *H01L 23/473* | (2006.01) | |
| *H01L 23/495* | (2006.01) | |
| *H01L 23/538* | (2006.01) | |
| *H01L 25/00* | (2006.01) | |
| *H01L 25/07* | (2006.01) | |
| *H02J 7/00* | (2006.01) | |
| *H02M 1/00* | (2006.01) | |
| *H02M 1/08* | (2006.01) | |
| *H02M 1/084* | (2006.01) | |
| *H02M 1/088* | (2006.01) | |
| *H02M 1/12* | (2006.01) | |
| *H02M 1/32* | (2007.01) | |
| *H02M 1/42* | (2007.01) | |
| *H02M 1/44* | (2007.01) | |
| *H02M 7/00* | (2006.01) | |
| *H02M 7/537* | (2006.01) | |
| *H02M 7/5387* | (2007.01) | |
| *H02M 7/5395* | (2006.01) | |
| *H02P 27/06* | (2006.01) | |
| *H02P 27/08* | (2006.01) | |
| *H02P 29/024* | (2016.01) | |
| *H02P 29/68* | (2016.01) | |
| *H05K 1/14* | (2006.01) | |
| *H05K 1/18* | (2006.01) | |
| *H05K 5/02* | (2006.01) | |
| *H05K 7/20* | (2006.01) | |
| *H10D 64/01* | (2025.01) | |
| *B60L 15/20* | (2006.01) | |
| *H02M 3/335* | (2006.01) | |
| *H03K 19/20* | (2006.01) | |

(52) U.S. Cl.
CPC .............. *B60L 50/40* (2019.02); *B60L 50/51* (2019.02); *B60L 50/60* (2019.02); *B60L 50/64* (2019.02); *B60L 53/20* (2019.02); *B60L 53/22* (2019.02); *B60L 53/62* (2019.02); *B60R 16/02* (2013.01); *G01R 15/20* (2013.01); *G06F 1/08* (2013.01); *G06F 13/4004* (2013.01); *H01L 21/4882* (2013.01); *H01L 23/15* (2013.01); *H01L 23/3672* (2013.01); *H01L 23/3675* (2013.01); *H01L 23/3735* (2013.01); *H01L 23/4006* (2013.01); *H01L 23/467* (2013.01); *H01L 23/473* (2013.01); *H01L 23/49562* (2013.01); *H01L 23/5383* (2013.01); *H01L 24/32* (2013.01); *H01L 24/33* (2013.01); *H01L 25/072* (2013.01); *H01L 25/50* (2013.01); *H02J 7/0063* (2013.01); *H02M 1/0054* (2021.05); *H02M 1/08* (2013.01); *H02M 1/084* (2013.01); *H02M 1/088* (2013.01); *H02M 1/123* (2021.05); *H02M 1/32* (2013.01); *H02M 1/322* (2021.05); *H02M 1/327* (2021.05); *H02M 1/4258* (2013.01); *H02M 1/44* (2013.01); *H02M 7/003* (2013.01); *H02M 7/537* (2013.01); *H02M 7/53871* (2013.01); *H02M 7/53875* (2013.01); *H02M 7/5395* (2013.01); *H02P 27/06* (2013.01); *H02P 27/08* (2013.01); *H02P 27/085* (2013.01); *H02P 29/024* (2013.01); *H02P 29/027* (2013.01); *H02P 29/68* (2016.02); *H05K 1/145* (2013.01); *H05K 1/181* (2013.01); *H05K 1/182* (2013.01); *H05K 5/0247* (2013.01); *H05K 7/20154* (2013.01); *H05K 7/2039* (2013.01); *H05K 7/2049* (2013.01); *H05K 7/20854* (2013.01); *H05K 7/209* (2013.01); *H05K 7/20927* (2013.01); *H10D 64/018* (2025.01); *B60L 15/20* (2013.01); *B60L 2210/30* (2013.01); *B60L 2210/40* (2013.01); *B60L 2210/42* (2013.01); *B60L 2210/44* (2013.01); *B60L 2240/36* (2013.01); *G06F 2213/40* (2013.01); *H01L 2023/405* (2013.01); *H01L 2023/4087* (2013.01); *H01L 2224/32225* (2013.01); *H01L 2224/32245* (2013.01); *H01L 2224/33181* (2013.01); *H02J 2207/20* (2020.01); *H02M 1/0009* (2021.05); *H02M 3/33523* (2013.01); *H02P 2207/05* (2013.01); *H03K 19/20* (2013.01); *H05K 2201/042* (2013.01); *H05K 2201/10166* (2013.01)

(58) Field of Classification Search
CPC .......... H02P 29/68; B60L 53/22; B60L 53/20; B60L 50/60; B60L 50/64; B60L 53/62; B60L 50/40; B60L 50/51
See application file for complete search history.

(56) References Cited

U.S. PATENT DOCUMENTS

| | | |
|---|---|---|
| 4,564,771 A | 1/1986 | Flohrs |
| 4,618,875 A | 10/1986 | Flohrs |
| 4,716,304 A | 12/1987 | Fiebig et al. |
| 5,068,703 A | 11/1991 | Conzelmann et al. |
| 5,432,371 A | 7/1995 | Denner et al. |
| 5,559,661 A | 9/1996 | Meinders |
| 5,654,863 A | 8/1997 | Davies |
| 5,764,007 A | 6/1998 | Jones |
| 5,841,312 A | 11/1998 | Mindl et al. |
| 6,028,470 A | 2/2000 | Michel et al. |
| 6,163,138 A | 12/2000 | Kohl et al. |
| 6,351,173 B1 | 2/2002 | Ovens et al. |
| 6,426,857 B1 | 7/2002 | Doster et al. |
| 6,597,556 B1 | 7/2003 | Michel et al. |
| 6,812,553 B2 | 11/2004 | Gerbsch et al. |
| 6,943,293 B1 | 9/2005 | Jeter et al. |
| 7,095,098 B2 | 8/2006 | Gerbsch et al. |
| 7,229,855 B2 | 6/2007 | Murphy |
| 7,295,433 B2 | 11/2007 | Taylor et al. |
| 7,459,954 B2 | 12/2008 | Kuehner et al. |
| 7,538,425 B2 | 5/2009 | Myers et al. |
| 7,551,439 B2 | 6/2009 | Peugh et al. |

(56) References Cited

U.S. PATENT DOCUMENTS

| | | |
|---|---|---|
| 7,616,047 B2 | 11/2009 | Rees et al. |
| 7,724,046 B2 | 5/2010 | Wendt et al. |
| 7,750,720 B2 | 7/2010 | Dittrich |
| 9,088,159 B2 | 7/2015 | Peuser |
| 9,275,915 B2 | 3/2016 | Heinisch et al. |
| 9,373,970 B2 | 6/2016 | Feuerstack et al. |
| 9,431,932 B2 | 8/2016 | Schmidt et al. |
| 9,515,584 B2 | 12/2016 | Koller et al. |
| 9,548,675 B2 | 1/2017 | Schoenknecht |
| 9,806,607 B2 | 10/2017 | Ranmuthu et al. |
| 9,837,887 B1 | 12/2017 | Zhou et al. |
| 9,843,320 B2 | 12/2017 | Richter et al. |
| 9,871,444 B2 | 1/2018 | Ni et al. |
| 9,882,490 B2 | 1/2018 | Veeramreddi et al. |
| 10,111,285 B2 | 10/2018 | Shi et al. |
| 10,116,300 B2 | 10/2018 | Blasco et al. |
| 10,232,718 B2 | 3/2019 | Trunk et al. |
| 10,270,354 B1 | 4/2019 | Lu et al. |
| 10,291,225 B2 | 5/2019 | Li et al. |
| 10,505,529 B1 | 12/2019 | Takao |
| 10,525,847 B2 | 1/2020 | Strobel et al. |
| 10,797,579 B2 | 10/2020 | Hashim et al. |
| 10,924,001 B2 | 2/2021 | Li et al. |
| 11,082,052 B2 | 8/2021 | Jang et al. |
| 11,108,389 B2 | 8/2021 | Li et al. |
| 11,342,911 B2 | 5/2022 | Lee et al. |
| 11,838,011 B2 | 12/2023 | Li et al. |
| 11,843,320 B2 | 12/2023 | Sivakumar et al. |
| 11,848,426 B2 | 12/2023 | Zhang et al. |
| 11,851,038 B2 | 12/2023 | Solanki et al. |
| 11,855,522 B2 | 12/2023 | Rudolph et al. |
| 11,855,630 B2 | 12/2023 | Dake et al. |
| 11,870,338 B1 | 1/2024 | Narayanasamy |
| 11,872,997 B2 | 1/2024 | Hoos et al. |
| 11,881,859 B2 | 1/2024 | Gupta et al. |
| 11,888,391 B2 | 1/2024 | Balasubramanian et al. |
| 11,888,393 B2 | 1/2024 | Venkateswaran et al. |
| 11,901,803 B2 | 2/2024 | Ruck et al. |
| 11,901,881 B1 | 2/2024 | Narayanasamy |
| 11,909,319 B2 | 2/2024 | Esteghlal et al. |
| 11,916,426 B2 | 2/2024 | Oner et al. |
| 11,923,762 B2 | 3/2024 | Sethumadhavan et al. |
| 11,923,764 B1 | 3/2024 | Zhang |
| 11,923,799 B2 | 3/2024 | Ojha et al. |
| 11,925,119 B2 | 3/2024 | Male et al. |
| 11,927,624 B2 | 3/2024 | Patel et al. |
| 11,938,838 B2 | 3/2024 | Simonis et al. |
| 11,942,927 B2 | 3/2024 | Purcarea et al. |
| 11,942,934 B2 | 3/2024 | Ritter |
| 11,945,331 B2 | 4/2024 | Blemberg et al. |
| 11,945,522 B2 | 4/2024 | Matsumura et al. |
| 11,949,320 B2 | 4/2024 | Jaladanki et al. |
| 11,949,333 B2 | 4/2024 | Pahkala et al. |
| 11,955,896 B2 | 4/2024 | Liu et al. |
| 11,955,953 B2 | 4/2024 | Sinn et al. |
| 11,955,964 B2 | 4/2024 | Agarwal et al. |
| 11,962,234 B2 | 4/2024 | Narayanasamy et al. |
| 11,962,291 B2 | 4/2024 | Oberdieck et al. |
| 11,964,587 B2 | 4/2024 | Yukawa |
| 11,970,076 B2 | 4/2024 | Sarfert et al. |
| 11,977,404 B2 | 5/2024 | Chandrasekaran |
| 11,984,802 B2 | 5/2024 | Merkin et al. |
| 11,984,876 B2 | 5/2024 | Neidorff et al. |
| 11,990,776 B2 | 5/2024 | Dulle |
| 11,990,777 B2 | 5/2024 | Woll et al. |
| 11,996,686 B2 | 5/2024 | Chan et al. |
| 11,996,699 B2 | 5/2024 | Vasconcelos Araujo et al. |
| 11,996,714 B2 | 5/2024 | El Markhi et al. |
| 11,996,715 B2 | 5/2024 | Nandi et al. |
| 11,996,762 B2 | 5/2024 | Hembach et al. |
| 11,996,830 B2 | 5/2024 | Murthy et al. |
| 11,996,847 B1 | 5/2024 | Kazama et al. |
| 12,003,191 B2 | 6/2024 | Chaudhary et al. |
| 12,003,229 B2 | 6/2024 | Kaya et al. |
| 12,003,237 B2 | 6/2024 | Waters |
| 12,008,847 B2 | 6/2024 | Braun et al. |
| 12,009,679 B2 | 6/2024 | Gottwald et al. |
| 12,012,057 B2 | 6/2024 | Schneider et al. |
| 12,015,342 B2 | 6/2024 | Kienzler et al. |
| 12,019,112 B2 | 6/2024 | Jarmolowitz et al. |
| 12,021,517 B2 | 6/2024 | S et al. |
| 2017/0222641 A1 | 8/2017 | Zou et al. |
| 2017/0264284 A1 | 9/2017 | Xu et al. |
| 2017/0331469 A1 | 11/2017 | Kilb et al. |
| 2019/0097563 A1 | 3/2019 | Shimomugi et al. |
| 2020/0195121 A1 | 6/2020 | Keskar et al. |
| 2021/0005711 A1 | 1/2021 | Martinez-Limia et al. |
| 2021/0159898 A1* | 5/2021 | Westwick ............... H02M 1/08 |
| 2022/0052610 A1 | 2/2022 | Plum |
| 2022/0182004 A1* | 6/2022 | Heckroth ............ H02M 1/0012 |
| 2022/0182041 A1 | 6/2022 | Tesu et al. |
| 2022/0294441 A1 | 9/2022 | Purcarea et al. |
| 2023/0010616 A1 | 1/2023 | Gschwantner et al. |
| 2023/0061922 A1 | 3/2023 | Ritter |
| 2023/0082076 A1 | 3/2023 | Strache et al. |
| 2023/0126070 A1 | 4/2023 | Oberdieck et al. |
| 2023/0179198 A1 | 6/2023 | Winkler |
| 2023/0231210 A1 | 7/2023 | Joos et al. |
| 2023/0231400 A1 | 7/2023 | Oberdieck et al. |
| 2023/0231496 A1 | 7/2023 | Syed et al. |
| 2023/0238808 A1 | 7/2023 | Swoboda et al. |
| 2023/0268826 A1 | 8/2023 | Yan et al. |
| 2023/0327577 A1* | 10/2023 | Saito ................ H02M 7/53871 |
| | | 363/95 |
| 2023/0335509 A1 | 10/2023 | Poddar |
| 2023/0365086 A1 | 11/2023 | Schumacher et al. |
| 2023/0370062 A1 | 11/2023 | Wolf |
| 2023/0378022 A1 | 11/2023 | Kim et al. |
| 2023/0386963 A1 | 11/2023 | Kim et al. |
| 2023/0402930 A1 | 12/2023 | Corry et al. |
| 2023/0412109 A1* | 12/2023 | Lim ................... H02P 23/0027 |
| 2023/0420968 A1 | 12/2023 | Oner et al. |
| 2023/0421049 A1 | 12/2023 | Neidorff |
| 2024/0006869 A1 | 1/2024 | Kim et al. |
| 2024/0006899 A1 | 1/2024 | Wernerus |
| 2024/0006993 A1 | 1/2024 | Barjati et al. |
| 2024/0022161 A1* | 1/2024 | Nguyen ................... H02M 1/08 |
| 2024/0022187 A1 | 1/2024 | Fassnacht |
| 2024/0022240 A1 | 1/2024 | Balaz |
| 2024/0022244 A1 | 1/2024 | S et al. |
| 2024/0030730 A1 | 1/2024 | Wernerus |
| 2024/0039062 A1 | 2/2024 | Wernerus |
| 2024/0039402 A1 | 2/2024 | Bafna et al. |
| 2024/0039406 A1 | 2/2024 | Chen et al. |
| 2024/0048048 A1 | 2/2024 | Zhang |
| 2024/0055488 A1 | 2/2024 | Lee et al. |
| 2024/0067116 A1 | 2/2024 | Qiu |
| 2024/0072675 A1 | 2/2024 | Formenti et al. |
| 2024/0072817 A1 | 2/2024 | K et al. |
| 2024/0077899 A1 | 3/2024 | Chitnis et al. |
| 2024/0078204 A1 | 3/2024 | Roehrle et al. |
| 2024/0079950 A1 | 3/2024 | Narayanasamy |
| 2024/0079958 A1 | 3/2024 | Kumar et al. |
| 2024/0080028 A1 | 3/2024 | Dake et al. |
| 2024/0088647 A1 | 3/2024 | Ramadass et al. |
| 2024/0088896 A1 | 3/2024 | Bilhan et al. |
| 2024/0097437 A1 | 3/2024 | Goyal et al. |
| 2024/0097459 A1 | 3/2024 | Swoboda et al. |
| 2024/0105276 A1 | 3/2024 | Duryea |
| 2024/0106248 A1 | 3/2024 | Woll et al. |
| 2024/0106435 A1 | 3/2024 | Zhang et al. |
| 2024/0113517 A1 | 4/2024 | Sriraj et al. |
| 2024/0113611 A1 | 4/2024 | Kaufmann et al. |
| 2024/0113620 A1 | 4/2024 | Ranmuthu et al. |
| 2024/0113624 A1 | 4/2024 | Southard et al. |
| 2024/0120558 A1 | 4/2024 | Zhang et al. |
| 2024/0120765 A1 | 4/2024 | Oner et al. |
| 2024/0120962 A1 | 4/2024 | Miriyala et al. |
| 2024/0128851 A1 | 4/2024 | Ruck et al. |
| 2024/0128859 A1 | 4/2024 | Chen |
| 2024/0128867 A1 | 4/2024 | Wang et al. |
| 2024/0146177 A1 | 5/2024 | Mehdi et al. |
| 2024/0146306 A1 | 5/2024 | Ramkaj et al. |
| 2024/0149734 A1 | 5/2024 | Eisenlauer |

(56) References Cited

U.S. PATENT DOCUMENTS

| | | |
|---|---|---|
| 2024/0162723 A1 | 5/2024 | Zipf et al. |
| 2024/0178756 A1 | 5/2024 | El-Markhi et al. |
| 2024/0178824 A1 | 5/2024 | Kazama et al. |
| 2024/0186803 A1 | 6/2024 | Krieg et al. |
| 2024/0198937 A1 | 6/2024 | Benqassmi et al. |
| 2024/0198938 A1 | 6/2024 | Carlos et al. |
| 2024/0204540 A1 | 6/2024 | Majmunovic et al. |
| 2024/0204541 A1 | 6/2024 | Majmunovic et al. |
| 2024/0204671 A1 | 6/2024 | Liu et al. |
| 2024/0204765 A1 | 6/2024 | Dake |
| 2024/0213874 A1 | 6/2024 | Junnarkar et al. |
| 2024/0213971 A1 | 6/2024 | Lee |
| 2024/0213975 A1 | 6/2024 | Narayanasamy |
| 2024/0213981 A1 | 6/2024 | Agarwal et al. |

FOREIGN PATENT DOCUMENTS

| | | | |
|---|---|---|---|
| NO | 2023094053 A1 | 6/2023 | |
| WO | 2007093598 A1 | 8/2007 | |
| WO | 2019034505 A1 | 2/2019 | |
| WO | 2020156820 A1 | 8/2020 | |
| WO | 2020239797 A1 | 12/2020 | |
| WO | 2021110405 A1 | 6/2021 | |
| WO | 2021213728 A1 | 10/2021 | |
| WO | 2022012943 A1 | 1/2022 | |
| WO | 2022229149 A1 | 11/2022 | |
| WO | 2023006491 A1 | 2/2023 | |
| WO | 2023046607 A1 | 3/2023 | |
| WO | 2023110991 A1 | 6/2023 | |
| WO | 2023147907 A1 | 8/2023 | |
| WO | 2023151850 A1 | 8/2023 | |
| WO | 2023227278 A1 | 11/2023 | |
| WO | 2023237248 A1 | 12/2023 | |
| WO | 2024006181 A2 | 1/2024 | |
| WO | 2024012743 A1 | 1/2024 | |
| WO | 2024012744 A1 | 1/2024 | |
| WO | 2024022219 A1 | 2/2024 | |
| WO | 2024041776 A1 | 2/2024 | |
| WO | 2024046614 A1 | 3/2024 | |
| WO | 2024049730 A1 | 3/2024 | |
| WO | 2024049884 A1 | 3/2024 | |
| WO | 2024049909 A1 | 3/2024 | |
| WO | 2024056388 A1 | 3/2024 | |
| WO | 2024068065 A1 | 4/2024 | |
| WO | 2024068076 A1 | 4/2024 | |
| WO | 2024068113 A1 | 4/2024 | |
| WO | 2024068115 A1 | 4/2024 | |
| WO | 2024083391 A1 | 4/2024 | |
| WO | 2024093384 A1 | 5/2024 | |
| WO | 2024104970 A1 | 5/2024 | |
| WO | 2024108401 A1 | 5/2024 | |
| WO | 2024110106 A1 | 5/2024 | |
| WO | 2024110265 A1 | 5/2024 | |
| WO | 2024110297 A1 | 5/2024 | |
| WO | 2024114978 A1 | 6/2024 | |
| WO | 2024114979 A1 | 6/2024 | |
| WO | 2024114980 A1 | 6/2024 | |
| WO | 2024128286 A1 | 6/2024 | |
| WO | 2024132249 A1 | 6/2024 | |

OTHER PUBLICATIONS

"New products," 5 Pages, Retrieved from internet URL:https://www.ti.com/product-category/new-products.html?%20releasePeriod=364#releasePeriod=90.

"Qualcomm and Bosch Showcase New Central Vehicle Computer for Digital Cockpit and Driver Assistance Functions at CES 2024," 2024, 8 Pages. Retrieved from internet URL:https://www.qualcomm.com/news/releases/2024/01/qualcomm-and-bosch-showcase-new-central-vehicle-computer-for-dig.

Balogh, L., "Fundamentals of MOSFET and IGBT Gate Driver Circuits," Texas Instruments Application Report, SLUA618—Mar. 2017, Retrieved from internet URL: https://ghioni.faculty.polimi.it/pel/readmat/gate-drive.pdf, 65 pages.

Baranwal, S., "Common-mode transient immunity for isolated gate drivers," Analog Applications Journal, Texas Instruments (2015), Retrieved from internet URL: https://www.ti.com/lit/an/slyt648/slyt648.pdf?ts=1702052336068&ref_url=https%253A%252F%252Fwww.google.com%252F, 07 pages.

Boomer, K. and Ahmad H., "Performance Evaluation of an Automotive-Grade, High-Speed Gate Driver for SiC FETs, Type UCC27531, Over a Wide Temperature Range," NASA Electronic Parts and Packaging Program No. GRC-E-DAA-TN25898 (2015), Retrieved from Internet URL: https://ntrs.nasa.gov/api/citations/20150023034/downloads/20150023034.pdf, 08 pages.

Ke, X, et al., "A 3-to-40V 10-to-30MHz Automotive-Use GaN Driver with Active BST Balancing and VSW Dual-Edge Dead-Time Modulation Achieving 8.3% Efficiency Improvement and 3.4ns Constant Propagation Delay," 2016 IEEE International Solid-State Circuits Conference (ISSCC), IEEE, 2016, Retrieved from internet URL: https://picture.iczhiku.com/resource/ieee/WYkrsJrSQPoSjNXm.pdf, 03 pages.

Sridhar, N., "Impact of an Isolated Gate Driver," Texas Instruments: Dallas, Texas (2019), Retrieved from Internet URL: https://www.ti.com/lit/wp/slyy140a/slyy140a.pdf, 08 pages.

Sridhar, N., "Power Electronics in Motor Drives: Where is it?" Texas Instruments (2015), Retrieved from Internet URL: https://www.ti.com/lit/wp/slyy078a/slyy078a.pdf, 09 pages.

Sridhar, N., "Silicon Carbide Gate Drivers—a Disruptive Technology in Power Electronics," Texas Instruments, Dallas, Texas (2019), Retrieved from Internet URL: https://www.ti.com/lit/wp/slyy139/slyy139.pdf, 07 pages.

* cited by examiner

SYSTEMS AND METHODS FOR ADAPTIVE GATE DRIVER FOR INVERTER FOR ELECTRIC VEHICLE

CROSS-REFERENCE TO RELATED APPLICATION(S)

This application claims the benefit of priority to U.S. Provisional Patent Application No. 63/377,486, filed Sep. 28, 2022, U.S. Provisional Patent Application No. 63/377,501, filed Sep. 28, 2022, U.S. Provisional Patent Application No. 63/377,512, filed Sep. 28, 2022, and U.S. Provisional Patent Application No. 63/378,601, filed Oct. 6, 2022, the entireties of which are incorporated by reference herein.

TECHNICAL FIELD

Various embodiments of the present disclosure relate generally to systems and methods for an adaptive gate driver for an inverter for an electric vehicle, and, more particularly, to systems and methods for an adaptive gate driver for a power device switch for an inverter for an electric vehicle.

BACKGROUND

Inverters, such as those used to drive a motor in an electric vehicle, for example, are responsible for converting High Voltage Direct Current (HVDC) into Alternating Current (AC) to drive the motor. In an inverter, switching losses of a power device switch can contribute to the inefficiencies of the inverter.

The present disclosure is directed to overcoming one or more of these above-referenced challenges.

SUMMARY OF THE DISCLOSURE

In some aspects, the techniques described herein relate to a system including: an inverter configured to convert DC power from a battery to AC power to drive a motor, wherein the inverter includes: a power switch including a drain terminal, a source terminal, and a gate terminal; a gate driver configured to provide a signal to the gate terminal, the gate driver including one or more of a resistive gate driver with variable resistance or a current gate driver with variable current; and one or more controllers configured to detect a voltage from the gate terminal to the source terminal of the power switch, and control the gate driver based on the detected voltage.

In some aspects, the techniques described herein relate to a system, wherein the one or more controllers includes one or more point-of-use controllers on a power module with the power switch.

In some aspects, the techniques described herein relate to a system, wherein the drain terminal of the power switch is configured to be connected to a positive terminal of the battery, and the source terminal of the power switch is configured to be connected to a phase terminal of the motor.

In some aspects, the techniques described herein relate to a system, wherein the source terminal of the power switch is configured to be connected to a negative terminal of the battery, and the drain terminal of the power switch is configured to be connected to a phase terminal of the motor.

In some aspects, the techniques described herein relate to a system, wherein the resistive gate driver with variable resistance includes one or more resistors in series with one or more switches, wherein each resistor of the one or more resistors is in series with each switch of the one or more switches, and wherein the one or more controllers is configured to control the gate driver by controlling the resistive gate driver by operating the one or more switches to change the variable resistance of the resistive gate driver.

In some aspects, the techniques described herein relate to a system, wherein the resistive gate driver further includes a clamp switch to bypass the one or more resistors in series with one or more switches.

In some aspects, the techniques described herein relate to a system, wherein the current gate driver with variable current includes one or more current drivers in series with one or more switches, wherein each current driver of the one or more current drivers is in series with each switch of the one or more switches, and wherein the one or more controllers is configured to control the gate driver by controlling the current gate driver by operating the one or more switches to change the current of the current gate driver.

In some aspects, the techniques described herein relate to a system, wherein the one or more controllers is configured to: perform a comparison of the detected voltage to one or more threshold values, load a gate driver profile, from among a plurality of gate driver profiles, based on the comparison, and control the gate driver based on the loaded gate driver profile.

In some aspects, the techniques described herein relate to a system, wherein the gate driver includes both of the resistive gate driver with variable resistance and the current gate driver with variable current.

In some aspects, the techniques described herein relate to a system, further including: the battery configured to supply the DC power to the inverter; and the motor configured to receive the AC power from the inverter to drive the motor.

In some aspects, the techniques described herein relate to a system including: a power module for an inverter for an electric vehicle, the power module including: a power switch including a drain terminal, a source terminal, and a gate terminal; a gate driver configured to provide a signal to the gate terminal, the gate driver including one or more of a resistive gate driver with variable resistance or a current gate driver with variable current; and one or more point-of-use controllers configured to detect a voltage from the gate terminal to the source terminal of the power switch, and control the gate driver based on the detected voltage.

In some aspects, the techniques described herein relate to a system, wherein the resistive gate driver with variable resistance includes one or more resistors in series with one or more switches, wherein each resistor of the one or more resistors is in series with each switch of the one or more switches, and wherein the one or more point-of-use controllers is configured to control the gate driver by controlling the resistive gate driver by operating the one or more switches to change the variable resistance of the resistive gate driver.

In some aspects, the techniques described herein relate to a system, wherein the resistive gate driver further includes a clamp switch to bypass the one or more resistors in series with one or more switches.

In some aspects, the techniques described herein relate to a system, wherein the current gate driver with variable current includes one or more current drivers in series with one or more switches, wherein each current driver of the one or more current drivers is in series with each switch of the one or more switches, and wherein the one or more point-of-use controllers is configured to control the gate driver by controlling the current gate driver by operating the one or more switches to change the current of the current gate driver.

In some aspects, the techniques described herein relate to a system, wherein the one or more point-of-use controllers is configured to: perform a comparison of the detected voltage to one or more threshold values, load a gate driver profile, from among a plurality of gate driver profiles, based on the comparison, and control the gate driver based on the loaded gate driver profile.

In some aspects, the techniques described herein relate to a system, wherein the gate driver profile is determined based on one or more of an intrinsic characteristic of the power switch, load-current slope and amplitude value, high-voltage battery amplitude of the inverter, or operating temperature of the power switch.

In some aspects, the techniques described herein relate to a system, wherein the gate driver includes both of the resistive gate driver with variable resistance and the current gate driver with variable current.

In some aspects, the techniques described herein relate to a method including: receiving, by one or more controllers, a voltage from a gate terminal to a source terminal of a power switch for an inverter for an electric vehicle; comparing, by the one or more controllers, the voltage to one or more threshold values; loading, by the one or more controllers, a gate driver profile, from among a plurality of gate driver profiles, based on the comparing; and controlling, by the one or more controllers, a gate driver of the power switch based on the loaded gate driver profile.

In some aspects, the techniques described herein relate to a method, wherein the controlling the gate driver includes: controlling an operation of one or more switches of the gate driver to change one or more of a variable resistance of a resistive gate driver of the gate driver or a current of a current gate driver of the gate driver.

In some aspects, the techniques described herein relate to a method, wherein the gate driver profile is determined based on one or more of an intrinsic characteristic of the power switch, load-current slope and amplitude value, high-voltage battery amplitude of the inverter, or operating temperature of the power switch.

Additional objects and advantages of the disclosed embodiments will be set forth in part in the description that follows, and in part will be apparent from the description, or may be learned by practice of the disclosed embodiments. The objects and advantages of the disclosed embodiments will be realized and attained by means of the elements and combinations particularly pointed out in the appended claims.

It is to be understood that both the foregoing general description and the following detailed description are exemplary and explanatory only and are not restrictive of the disclosed embodiments, as claimed.

BRIEF DESCRIPTION OF THE DRAWINGS

The accompanying drawings, which are incorporated in and constitute a part of this specification, illustrate various exemplary embodiments and together with the description, serve to explain the principles of the disclosed embodiments.

DETAILED DESCRIPTION OF EMBODIMENTS

Figure 1:
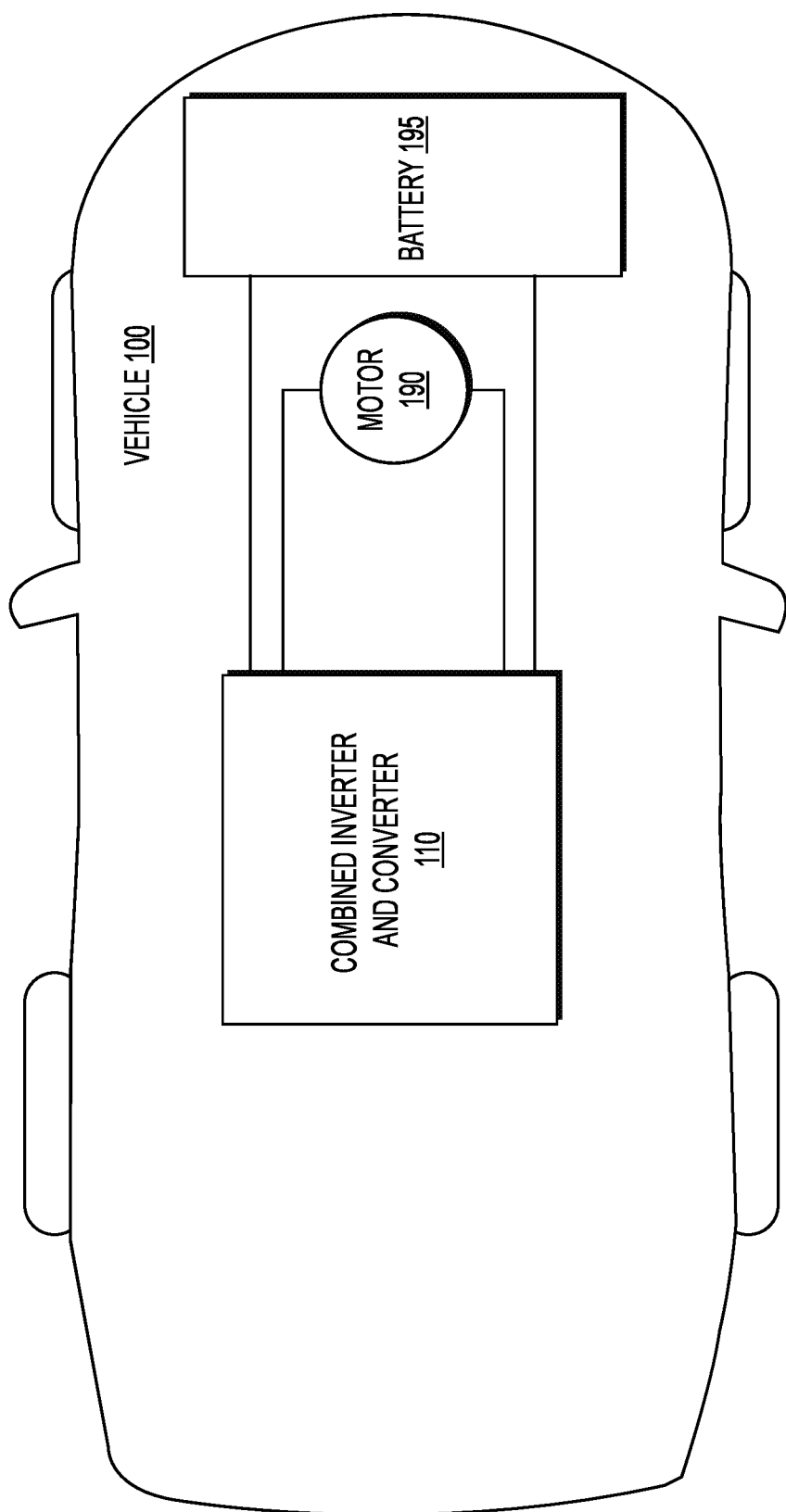
FIG. 1 depicts an exemplary system infrastructure for a vehicle including a combined inverter and converter, according to one or more embodiments.

Both the foregoing general description and the following detailed description are exemplary and explanatory only and are not restrictive of the features, as claimed. As used herein, the terms "comprises," "comprising," "has," "having," "includes," "including," or other variations thereof, are intended to cover a non-exclusive inclusion such that a process, method, article, or apparatus that comprises a list of elements does not include only those elements, but may include other elements not expressly listed or inherent to such a process, method, article, or apparatus. In this disclosure, unless stated otherwise, relative terms, such as, for example, "about," "substantially," and "approximately" are used to indicate a possible variation of ±10% in the stated value. In this disclosure, unless stated otherwise, any numeric value may include a possible variation of ±10% in the stated value.

The terminology used below may be interpreted in its broadest reasonable manner, even though it is being used in conjunction with a detailed description of certain specific examples of the present disclosure. Indeed, certain terms may even be emphasized below; however, any terminology intended to be interpreted in any restricted manner will be overtly and specifically defined as such in this Detailed Description section. For example, in the context of the disclosure, the switching devices may be described as switches or devices, but may refer to any device for controlling the flow of power in an electrical circuit. For example, switches may be metal-oxide-semiconductor field-effect transistors (MOSFETs), bipolar junction transistors (BJTs), insulated-gate bipolar transistors (IGBTs), or relays, for example, or any combination thereof, but are not limited thereto.

Various embodiments of the present disclosure relate generally to systems and methods for an adaptive gate driver for an inverter for an electric vehicle, and, more particularly, to systems and methods for an adaptive gate driver for a power device switch for an inverter for an electric vehicle.

Inverters, such as those used to drive a motor in an electric vehicle, for example, are responsible for converting High Voltage Direct Current (HVDC) into Alternating Current (AC) to drive the motor. A three phase inverter may include a bridge with six power device switches (for example, power transistors such as IGBT or MOSFET) that are controlled by Pulse Width Modulation (PWM) signals generated by a controller. An inverter may include three phase switches to control the phase voltage, upper and lower gate drivers to control the switches, a PWM controller, and glue logic between the PWM controller and the gate drivers. The PWM controller may generate signals to define the intended states of the system. The gate drivers may send the signals from the PWM controller to the phase switches. The phase switches may drive the phase voltage. The inverter may include an isolation barrier between low voltage and high voltage planes. Signals may pass from the PWM controller to the phase switches by passing across the isolation barrier, which may employ optical, transformer-based, or capacitance-based isolation. PWM signals may be distorted when passing through the glue logic, which may include resistive, capacitive, or other types of filtering. PWM signals may be distorted when passing through the gate driver, due to the galvanic isolation barrier and other delays within the gate driver. PWM signals may be distorted when the signals processed by the phase switch via the gate driver output.

Gate drivers may tolerate common-mode transients that occur during field-effect transistor (FET) switching and when one side of the floating high voltage terminal is shorted to ground or subject to an electro-static discharge. These voltage transients may result in fast edges, which may create bursts of common-mode current through the galvanic isolation. A gate driver may need to demonstrate common-mode transient immunity (CMTI) in order to be effective and safe.

Gate drivers may have a high-voltage domain in common to the voltage plane of an associated FET. Further, high-voltage planes may be supplied by a flyback converter that may be isolated through a transformer from the low-voltage plane. The high-voltage domain supply may be used to power circuits which source and sink gate current to drive the FET and which may detect FET faults so the faults can be acted upon and/or communicated to the low-voltage domain. Gate drivers may include a galvanic channel dedicated to FET commands, and one or more bidirectional or unidirectional galvanic channels dedicated to FET communications.

High current switching transients may create strong electro-magnetic (EM) fields that may couple into nearby metal traces. The magnitude and frequency of coupled currents may depend upon the layout of the FET packaging solution and the direction and length of metal traces between the FET and the control integrated circuit (IC). For example, typical values for coupled currents may be up to 1 A at AC frequencies up to 100 MHz. Typically, within a circuit, the gate driver IC may be placed far enough away from the FET that high EM fields do not couple directly into the internal metal traces within the gate driver IC. The gate driver is placed a distance from EM fields such that induced currents within the circuitry are below levels that will cause malfunction of the gate driver, or a metal shield is placed between the gate driver and the source of EM fields to protect the gate driver circuitry. The output terminals of the gate driver that connect to the FET are exposed to the EM fields at the point where the output terminals are no longer covered by a shield. The gate driver switches large currents (such as 5 A to 15 A, for example) through these exposed terminals. The switched large currents are generally greater in magnitude than the EM-induced currents. The gate driver is able to overdrive the induced currents to maintain control of the FETs. The high side of the gate drivers and the FET may share a common ground and a gate control signal trace, both of which may be susceptible to coupled currents.

Gate drivers may turn on low-resistance switches to source and sink gate currents. Series resistors may sometimes be added to limit gate current. Switched gate currents may be larger than coupled currents in order to maintain control of their respective FETs.

Gate drivers may be able to sense FET operating voltages or currents in order to provide feedback and react to faults. Over-current faults may typically be detected by sensing the FET drain to source voltage and comparing the sensed voltage to a reference value. Sensed voltages may be heavily filtered to reject coupled currents. Filtering may slow down the response to fault conditions, resulting in delays in response. For example, the rate of current increase due to a low resistance short circuit may reach damaging levels prior to being detected by the heavily filtered drain to source voltage detection strategy. The resulting short circuit may damage the FET or the vehicle, prior to being detected and shut off.

According to one or more embodiments, a FET driver circuit may provide rapid over-current detection by either shunt current sensing or by diverting a fraction of the load current through a parallel FET that may have a current sensing circuit. Utilizing either strategy may require a "point-of-use IC" where sensing circuitry is in close proximity to the FET. Even if a point-of-use IC and a remote controller are resistant to EM fields, communication between the point-of-use IC and remote controller remains susceptible to induced currents. Point-of-use ICs have been implemented in low EM field applications, such as smart FETs for automotive applications. However, point-of-use ICs have not been used in high EM field applications. A high EM field may be a field (i) that induces a current within an IC that is in excess of an operating current of the IC and leads to malfunction, or (ii) that induces a differential voltage within an IC which is in excess of the operating differential voltage and leads to malfunction. A high EM field may be a field that is greater than approximately 10 A or approximately 100V, for example.

As discussed above, for a phase power drive circuit, some circuits may include a gate driver to drive the gates terminals of the power switches. When both upper phase and lower phase power switches are the same type, then turn-on resistors for the upper phase and lower phase power switches are normally chosen to have low and equal resistance values, and turn-off resistors for the upper phase and lower phase power switches also have low and equal resistance values. The turn-on resistors normally have different resistance values than the turn-off resistors. To avoid shoot-through current in the upper phase and lower phase power switches, some circuits include a dead-time between the upper phase power switch turn-off and lower phase power switch turn-on times, and between lower phase power switch turn-off and upper phase power switch turn-on times. The switching losses of the power switches are directly determined by the values of the above-mentioned gate resistors and the total capacitance at the gate terminals of the power switches.

The values of these series gate resistors are chosen such that the turn-on gate voltage and drain current amplitude ringing and the turn-off drain to source voltage overshoot and ringing amplitude does not exceed the allowed maximum values under worst-case conditions. The worst-case conditions may include intrinsic parameters of the power switches, operating temperature, phase (load) current amplitude/slope, battery voltage magnitude, and parameter drift over the life of the power switches due to aging of the components. Any violation of the compliance voltage and current values may compromise the health of the power switches, and potentially cause permanent damage to the power switches. Therefore, the values of the gate resistors are increased to a suitable value higher than optimal resistance values so that the power switches do not experience any undue voltage and/or current stresses. However, the choice of higher values for the gate resistors significantly increases the switching losses of the power switches, which results in higher heat-sink and overall system costs.

One or more embodiments may provide a gate driver system that significantly reduces switching power losses while protecting the power switches with regard to the gate voltage and drain current ringing amplitude and the drain to source voltage overshoot and ringing amplitude. One or more embodiments may provide a gate driver system that computes optimum gate-drive turn-on and turn-off voltage profiles that incorporates intrinsic characteristics of power devices, load-current slope and amplitude, high-voltage battery amplitude, and operating temperature. One or more embodiments may provide a gate driver system that continuously measures threshold voltage drift over time of a power device, which may be used in the computation of the optimum gate-drive turn-on and turn-off voltage profiles, and in the detection of an open gate terminal fault. One or more embodiments may provide a gate driver system that uses a hybrid variable resistive driver along with fast transition switch-mode circuit, featuring a very low driving impedance for minimizing the switching turn-on and turn-off current and/or voltage ringing, while shortening the transition time to the full conduction time window. One or more embodiments may provide a gate driver system that continuously detects hard and/or soft short and/or open faults throughout the switching turn-on, turn-off, and conduction periods by continuously checking the gate voltage amplitude and rate of change of the gate voltage over time against several threshold voltages and pre-programmed time windows. One or more embodiments may provide a gate driver system that, for the case of turning on into hard short, computes a special turn-off profile to assure a safe turn-off of the power switch.

FIG. 1 depicts an exemplary system infrastructure for a vehicle including a combined inverter and converter, according to one or more embodiments. In the context of this disclosure, the combined inverter and converter may be referred to as an inverter. As shown in FIG. 1, electric vehicle 100 may include an inverter 110, a motor 190, and a battery 195. The inverter 110 may include components to receive electrical power from an external source and output electrical power to charge battery 195 of electric vehicle 100. The inverter 110 may convert DC power from battery 195 in electric vehicle 100 to AC power, to drive motor 190 of the electric vehicle 100, for example, but the embodiments are not limited thereto. The inverter 110 may be bidirectional, and may convert DC power to AC power, or convert AC power to DC power, such as during regenerative braking, for example. Inverter 110 may be a three-phase inverter, a single-phase inverter, or a multi-phase inverter.

Figure 2:
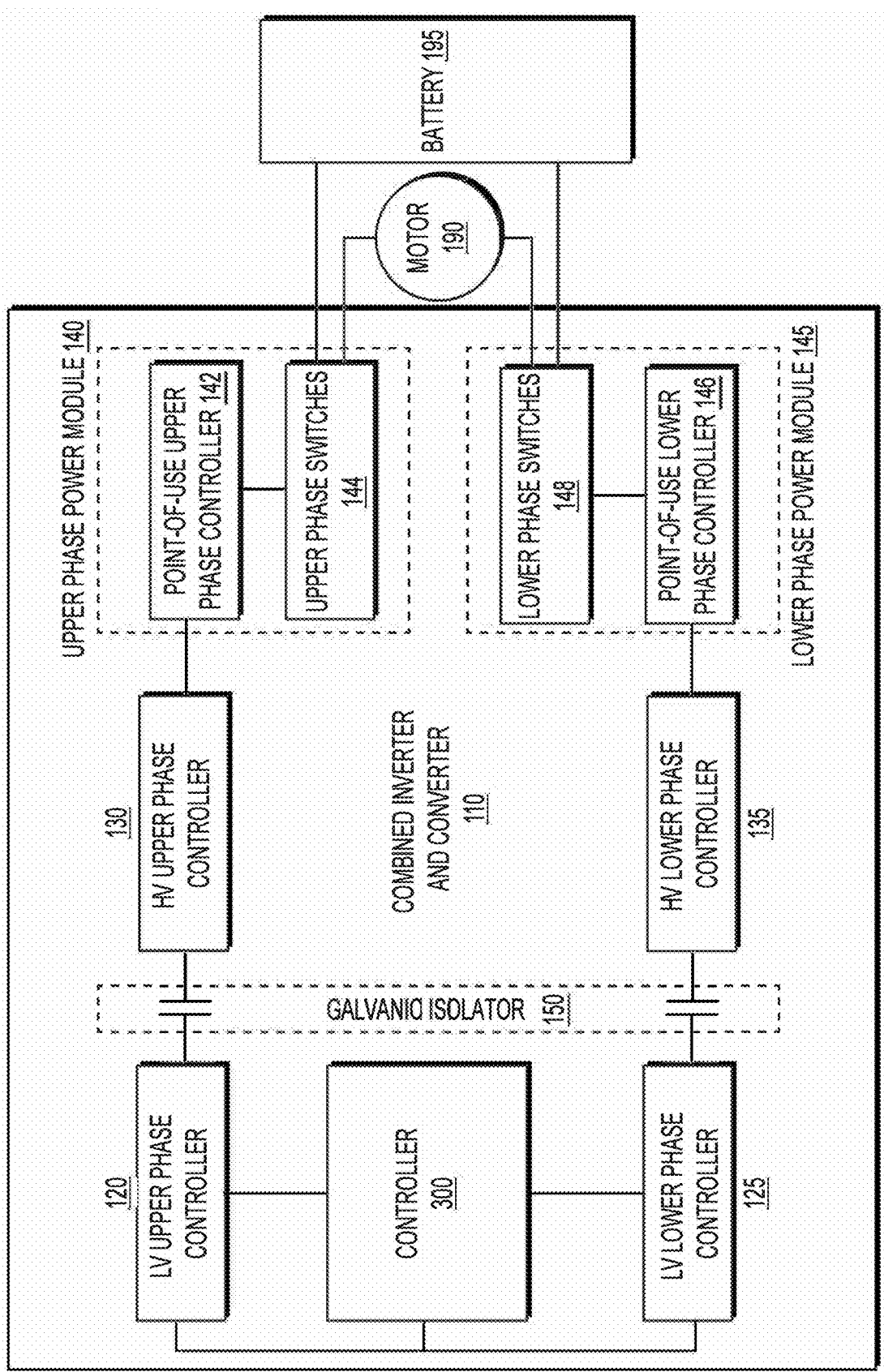
FIG. 2 depicts an exemplary system infrastructure for the combined inverter and converter of FIG. 1 with a point-of-use switch controller, according to one or more embodiments.

FIG. 2 depicts an exemplary system infrastructure for the inverter 110 of FIG. 1 with a point-of-use switch controller, according to one or more embodiments. Electric vehicle 100 may include inverter 110, motor 190, and battery 195. Inverter 110 may include an inverter controller 300 (shown in FIG. 3) to control the inverter 110. Inverter 110 may include a low voltage upper phase controller 120 separated from a high voltage upper phase controller 130 by a galvanic isolator 150, and an upper phase power module 140. Upper phase power module 140 may include a point-of-use upper phase controller 142 and upper phase switches 144. Inverter 110 may include a low voltage lower phase controller 125 separated from a high voltage lower phase controller 135 by galvanic isolator 150, and a lower phase power module 145. Lower phase power module 145 may include a point-of-use lower phase controller 146 and lower phase switches 148. Upper phase switches 144 and lower phase switches 148 may be connected to motor 190 and battery 195. Galvanic isolator 150 may be one or more of optical, transformer-based, or capacitance-based isolation. Galvanic isolator 150 may be one or more capacitors with a value from approximately 20 fF to approximately 100 fF, with a breakdown voltage from approximately 6 kV to approximately 12 kV, for example. Galvanic isolator 150 may include a pair of capacitors, where one capacitor of the pair carries a complementary (180 degree phase shifted) data signal from the other capacitor of the pair to create a differential signal for common-mode noise rejection. Galvanic isolator 150 may include more than one capacitor in series. Galvanic isolator 150 may include one capacitor located on a first IC, or may include a first capacitor located on a first IC and a second capacitor located on a second IC that communicates with the first IC.

Inverter 110 may include a low voltage area, where voltages are generally less than 5V, for example, and a high voltage area, where voltages may exceed 500V, for example. The low voltage area may be separated from the high voltage area by galvanic isolator 150. Inverter controller 300 may be in the low voltage area of inverter 110, and may send signals to and receive signals from low voltage upper phase controller 120. Low voltage upper phase controller 120 may be in the low voltage area of inverter 110, and may send signals to and receive signals from high voltage upper phase controller 130. Low voltage upper phase controller 120 may send signals to and receive signals from low voltage lower phase controller 125. High voltage upper phase controller 130 may be in the high voltage area of inverter 110. Accordingly, signals between low voltage upper phase controller 120 and high voltage upper phase controller 130 pass through galvanic isolator 150. High voltage upper phase controller 130 may send signals to and receive signals from point-of-use upper phase controller 142 in upper phase power module 140. Point-of-use upper phase controller 142 may send signals to and receive signals from upper phase switches 144. Upper phase switches 144 may be connected to motor 190 and battery 195. Upper phase switches 144 and lower phase switches 148 may be used to transfer energy from motor 190 to battery 195, from battery 195 to motor 190, from an external source to battery 195, or from battery 195 to an external source, for example. The lower phase system of inverter 110 may be similar to the upper phase system as described above.

Figure 3:
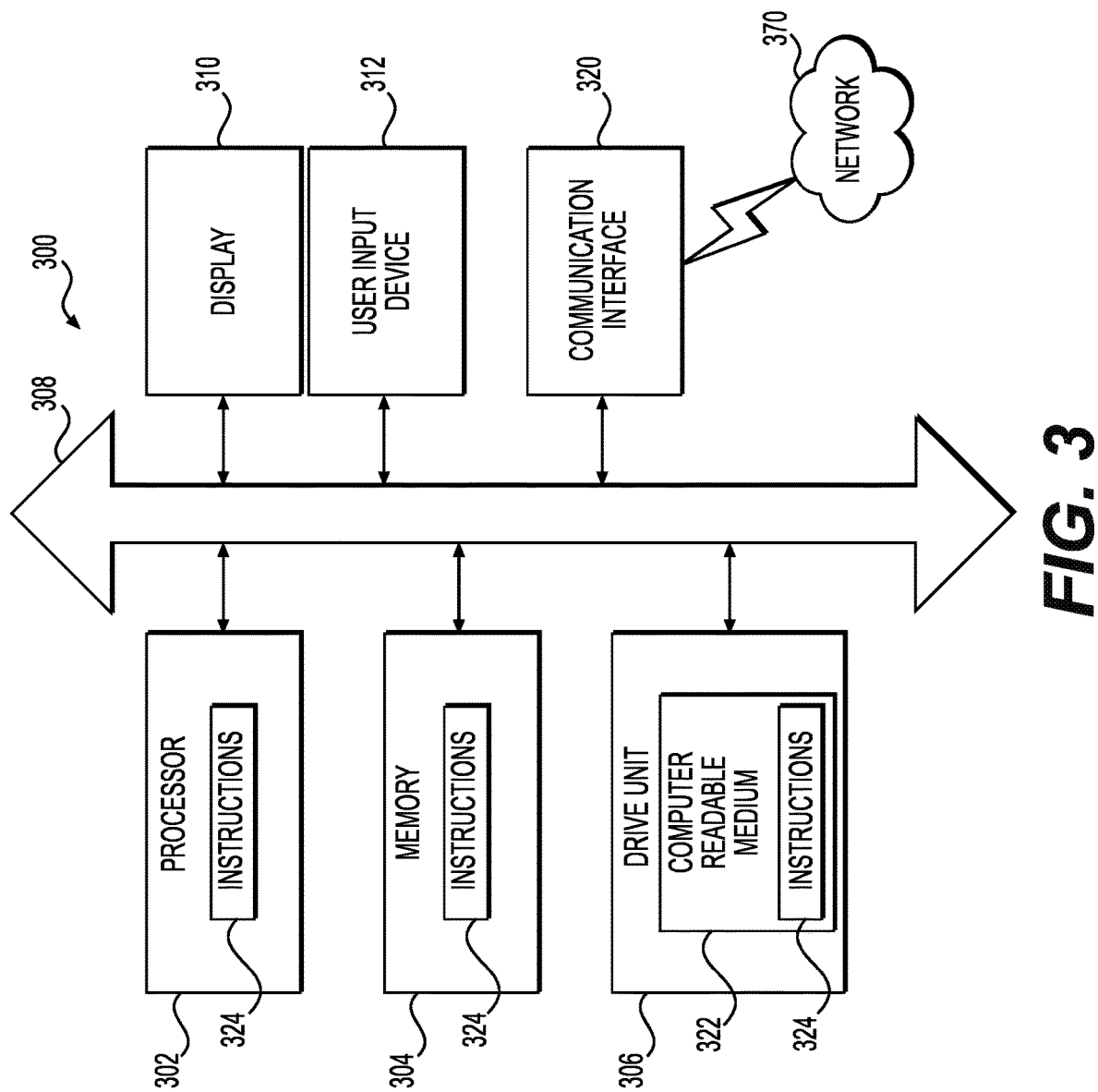
FIG. 3 depicts an exemplary system infrastructure for the controller of FIG. 2, according to one or more embodiments.

FIG. 3 depicts an exemplary system infrastructure for inverter controller 300 of FIG. 2, according to one or more embodiments. Inverter controller 300 may include one or more controllers.

The inverter controller 300 may include a set of instructions that can be executed to cause the inverter controller 300 to perform any one or more of the methods or computer based functions disclosed herein. The inverter controller 300 may operate as a standalone device or may be connected, e.g., using a network, to other computer systems or peripheral devices.

In a networked deployment, the inverter controller 300 may operate in the capacity of a server or as a client in a server-client user network environment, or as a peer computer system in a peer-to-peer (or distributed) network environment. The inverter controller 300 can also be implemented as or incorporated into various devices, such as a personal computer (PC), a tablet PC, a set-top box (STB), a personal digital assistant (PDA), a mobile device, a palmtop computer, a laptop computer, a desktop computer, a communications device, a wireless telephone, a land-line telephone, a control system, a camera, a scanner, a facsimile machine, a printer, a pager, a personal trusted device, a web appliance, a network router, switch or bridge, or any other machine capable of executing a set of instructions (sequential or otherwise) that specify actions to be taken by that machine. In a particular implementation, the inverter controller 300 can be implemented using electronic devices that provide voice, video, or data communication. Further, while the inverter controller 300 is illustrated as a single system, the term "system" shall also be taken to include any collection of systems or sub-systems that individually or jointly execute a set, or multiple sets, of instructions to perform one or more computer functions.

As shown in FIG. 3, the inverter controller 300 may include a processor 302, e.g., a central processing unit (CPU), a graphics processing unit (GPU), or both. The processor 302 may be a component in a variety of systems. For example, the processor 302 may be part of a standard inverter. The processor 302 may be one or more general processors, digital signal processors, application specific integrated circuits, field programmable gate arrays, servers, networks, digital circuits, analog circuits, combinations thereof, or other now known or later developed devices for analyzing and processing data. The processor 302 may implement a software program, such as code generated manually (i.e., programmed).

The inverter controller 300 may include a memory 304 that can communicate via a bus 308. The memory 304 may be a main memory, a static memory, or a dynamic memory. The memory 304 may include, but is not limited to computer readable storage media such as various types of volatile and non-volatile storage media, including but not limited to random access memory, read-only memory, programmable read-only memory, electrically programmable read-only memory, electrically erasable read-only memory, flash memory, magnetic tape or disk, optical media and the like. In one implementation, the memory 304 includes a cache or random-access memory for the processor 302. In alternative implementations, the memory 304 is separate from the processor 302, such as a cache memory of a processor, the system memory, or other memory. The memory 304 may be an external storage device or database for storing data. Examples include a hard drive, compact disc ("CD"), digital video disc ("DVD"), memory card, memory stick, floppy disc, universal serial bus ("USB") memory device, or any other device operative to store data. The memory 304 is operable to store instructions executable by the processor 302. The functions, acts or tasks illustrated in the figures or described herein may be performed by the processor 302 executing the instructions stored in the memory 304. The functions, acts or tasks are independent of the particular type of instructions set, storage media, processor or processing strategy and may be performed by software, hardware, integrated circuits, firm-ware, micro-code and the like, operating alone or in combination. Likewise, processing strategies may include multiprocessing, multitasking, parallel processing and the like.

As shown, the inverter controller 300 may further include a display 310, such as a liquid crystal display (LCD), an organic light emitting diode (OLED), a flat panel display, a solid-state display, a cathode ray tube (CRT), a projector, a printer or other now known or later developed display device for outputting determined information. The display 310 may act as an interface for the user to see the functioning of the processor 302, or specifically as an interface with the software stored in the memory 304 or in the drive unit 306.

Additionally or alternatively, the inverter controller 300 may include an input device 312 configured to allow a user to interact with any of the components of inverter controller 300. The input device 312 may be a number pad, a keyboard, or a cursor control device, such as a mouse, or a joystick, touch screen display, remote control, or any other device operative to interact with the inverter controller 300.

The inverter controller 300 may also or alternatively include drive unit 306 implemented as a disk or optical drive. The drive unit 306 may include a computer-readable medium 322 in which one or more sets of instructions 324, e.g. software, can be embedded. Further, the instructions 324 may embody one or more of the methods or logic as described herein. The instructions 324 may reside completely or partially within the memory 304 and/or within the processor 302 during execution by the inverter controller 300. The memory 304 and the processor 302 also may include computer-readable media as discussed above.

In some systems, a computer-readable medium 322 includes instructions 324 or receives and executes instructions 324 responsive to a propagated signal so that a device connected to a network 370 can communicate voice, video, audio, images, or any other data over the network 370. Further, the instructions 324 may be transmitted or received over the network 370 via a communication port or interface 320, and/or using a bus 308. The communication port or interface 320 may be a part of the processor 302 or may be a separate component. The communication port or interface 320 may be created in software or may be a physical connection in hardware. The communication port or interface 320 may be configured to connect with a network 370, external media, the display 310, or any other components in inverter controller 300, or combinations thereof. The connection with the network 370 may be a physical connection, such as a wired Ethernet connection or may be established wirelessly as discussed below. Likewise, the additional connections with other components of the inverter controller 300 may be physical connections or may be established wirelessly. The network 370 may alternatively be directly connected to a bus 308.

While the computer-readable medium 322 is shown to be a single medium, the term "computer-readable medium" may include a single medium or multiple media, such as a centralized or distributed database, and/or associated caches and servers that store one or more sets of instructions. The term "computer-readable medium" may also include any medium that is capable of storing, encoding, or carrying a set of instructions for execution by a processor or that cause a computer system to perform any one or more of the methods or operations disclosed herein. The computer-readable medium 322 may be non-transitory, and may be tangible.

The computer-readable medium 322 can include a solid-state memory such as a memory card or other package that houses one or more non-volatile read-only memories. The computer-readable medium 322 can be a random-access memory or other volatile re-writable memory. Additionally or alternatively, the computer-readable medium 322 can include a magneto-optical or optical medium, such as a disk or tapes or other storage device to capture carrier wave signals such as a signal communicated over a transmission medium. A digital file attachment to an e-mail or other self-contained information archive or set of archives may be considered a distribution medium that is a tangible storage medium. Accordingly, the disclosure is considered to include any one or more of a computer-readable medium or a distribution medium and other equivalents and successor media, in which data or instructions may be stored.

In an alternative implementation, dedicated hardware implementations, such as application specific integrated circuits, programmable logic arrays and other hardware devices, can be constructed to implement one or more of the methods described herein. Applications that may include the apparatus and systems of various implementations can broadly include a variety of electronic and computer systems. One or more implementations described herein may implement functions using two or more specific interconnected hardware modules or devices with related control and data signals that can be communicated between and through the modules, or as portions of an application-specific integrated circuit. Accordingly, the present system encompasses software, firmware, and hardware implementations.

The inverter controller 300 may be connected to a network 370. The network 370 may define one or more networks including wired or wireless networks. The wireless network may be a cellular telephone network, an 802.11, 802.16, 802.20, or WiMAX network. Further, such networks may include a public network, such as the Internet, a private network, such as an intranet, or combinations thereof, and may utilize a variety of networking protocols now available or later developed including, but not limited to TCP/IP based networking protocols. The network 370 may include wide area networks (WAN), such as the Internet, local area networks (LAN), campus area networks, metropolitan area networks, a direct connection such as through a Universal Serial Bus (USB) port, or any other networks that may allow for data communication. The network 370 may be configured to couple one computing device to another computing device to enable communication of data between the devices. The network 370 may generally be enabled to employ any form of machine-readable media for communicating information from one device to another. The network 370 may include communication methods by which information may travel between computing devices. The network 370 may be divided into sub-networks. The sub-networks may allow access to all of the other components connected thereto or the sub-networks may restrict access between the components. The network 370 may be regarded as a public or private network connection and may include, for example, a virtual private network or an encryption or other security mechanism employed over the public Internet, or the like.

In accordance with various implementations of the present disclosure, the methods described herein may be implemented by software programs executable by a computer system. Further, in an exemplary, non-limited implementation, implementations can include distributed processing, component or object distributed processing, and parallel processing. Alternatively, virtual computer system processing can be constructed to implement one or more of the methods or functionality as described herein.

Although the present specification describes components and functions that may be implemented in particular implementations with reference to particular standards and protocols, the disclosure is not limited to such standards and protocols. For example, standards for Internet and other packet switched network transmission (e.g., TCP/IP, UDP/IP, HTML, HTTP) represent examples of the state of the art. Such standards are periodically superseded by faster or more efficient equivalents having essentially the same functions. Accordingly, replacement standards and protocols having the same or similar functions as those disclosed herein are considered equivalents thereof.

It will be understood that the operations of methods discussed are performed in one embodiment by an appropriate processor (or processors) of a processing (i.e., computer) system executing instructions (computer-readable code) stored in storage. It will also be understood that the disclosure is not limited to any particular implementation or programming technique and that the disclosure may be implemented using any appropriate techniques for implementing the functionality described herein. The disclosure is not limited to any particular programming language or operating system.

Figure 4:
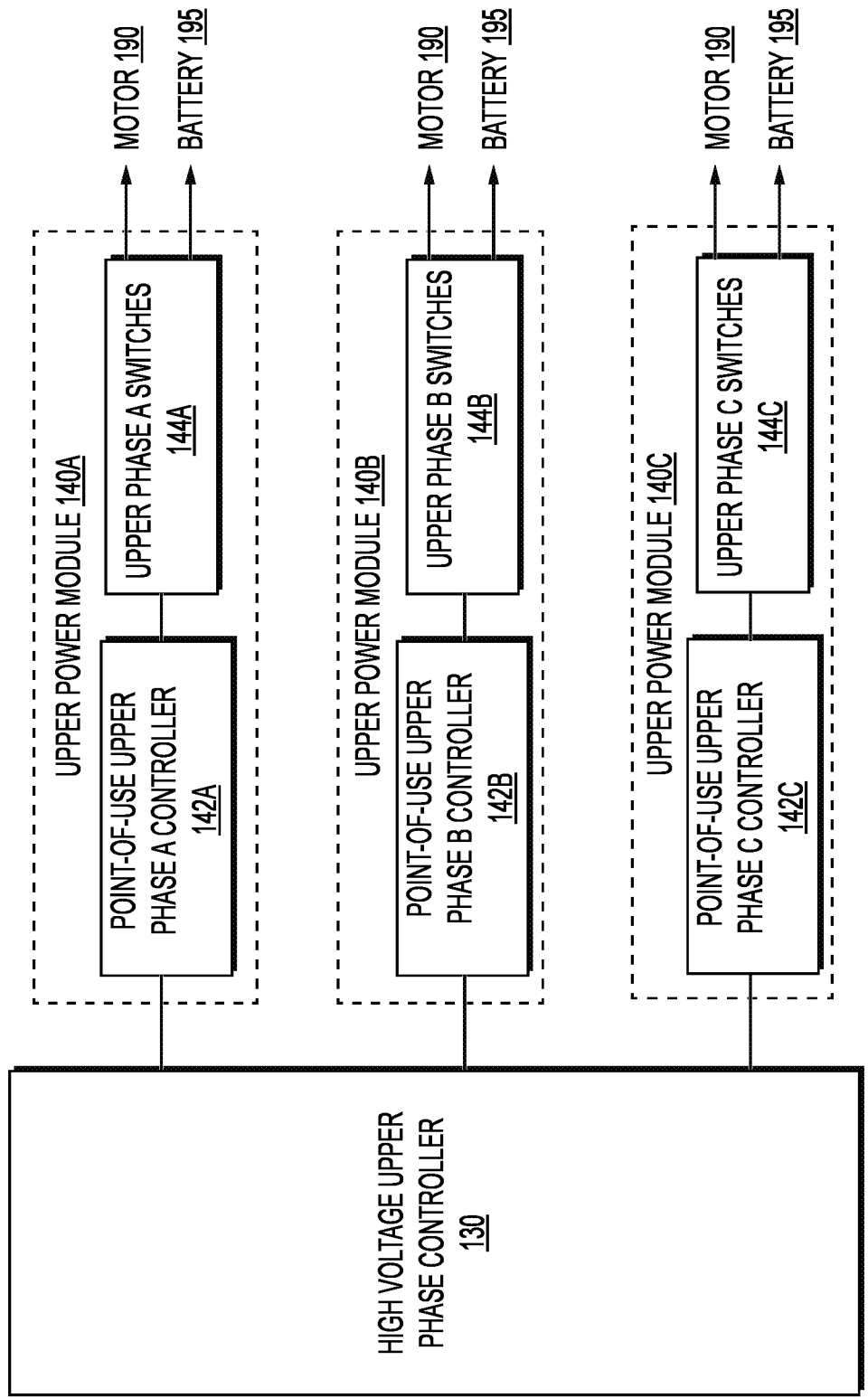
FIG. 4 depicts an exemplary system infrastructure for the point-of-use switch controller of FIG. 2, according to one or more embodiments.

FIG. 4 depicts an exemplary system infrastructure for the point-of-use switch controller of FIG. 2, according to one or more embodiments. For a three-phase inverter, each of the upper phase and the lower phase may include three phases correlating with phases A, B, and C. For example, upper phase power module 140 may include upper phase power module 140A for upper phase A, upper phase power module 140B for upper phase B, and upper phase power module 140C for upper phase C. Upper phase power module 140A may include point-of-use upper phase A controller 142A and upper phase A switches 144A. Upper phase power module 140B may include point-of-use upper phase B controller 142B and upper phase B switches 144B. Upper phase power module 140C may include point-of-use upper phase C controller 142C and upper phase C switches 144C. Each of the upper phase A switches 144A, upper phase B switches 144B, and upper phase C switches 144C may be connected to motor 190 and battery 195. FIG. 4 depicts details of the upper phase power module 140. Although not shown, the lower phase power module 145 may include a similar structure as the upper phase power module 140 for lower phases A, B, and C.

Figure 5:
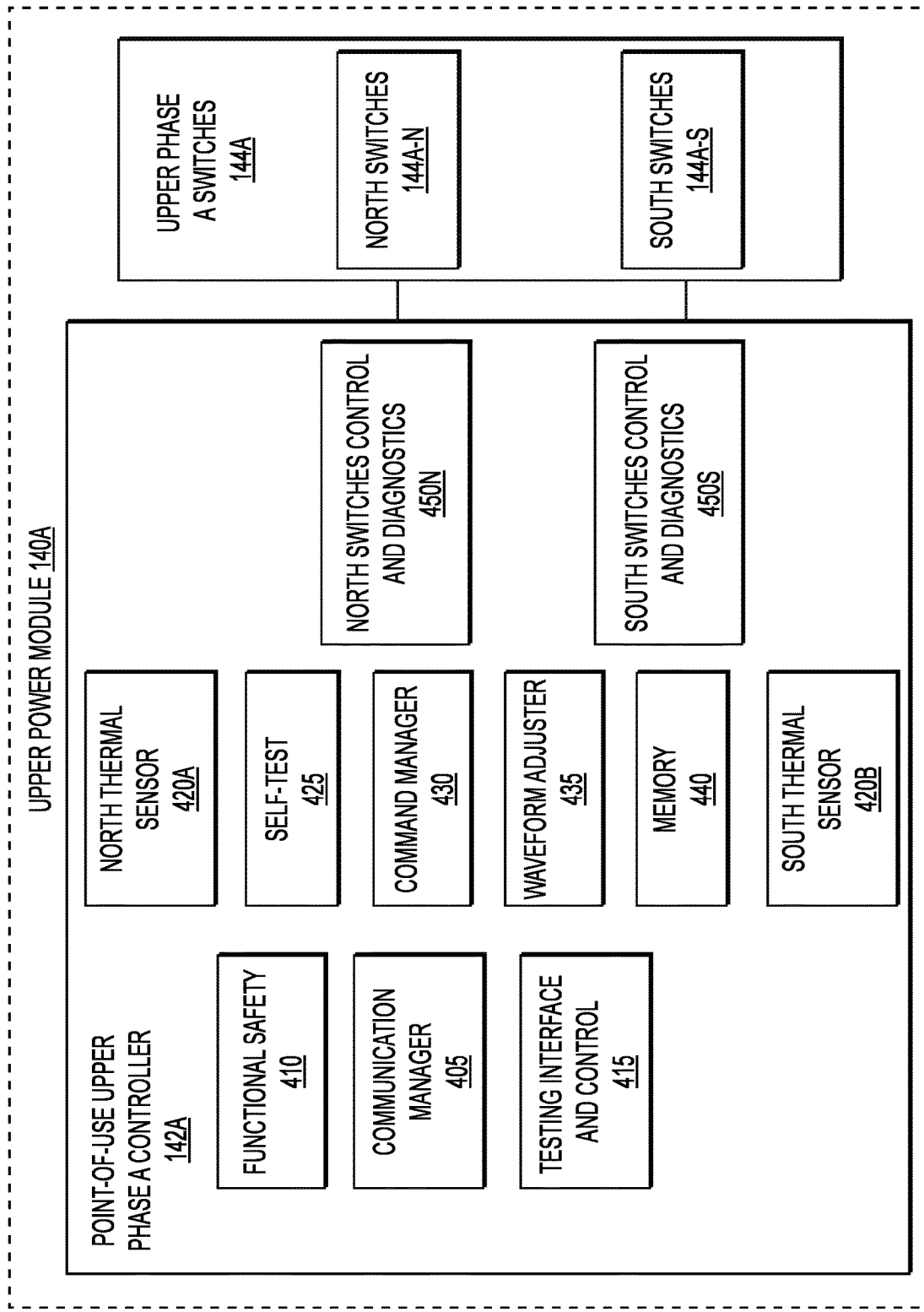
FIG. 5 depicts an exemplary system infrastructure for the upper power module of FIG. 4, according to one or more embodiments.

FIG. 5 depicts an exemplary system infrastructure for the upper power module of FIG. 4, according to one or more embodiments. For example, FIG. 5 provides additional details of upper phase power module 140A. Although not shown, upper phase power module 140B, upper phase power module 140C, and respective lower phase power modules of lower phase power module 145 may include a similar structure as the upper phase power module 140A shown in FIG. 5. Moreover, the terms upper, lower, north, and south used in the disclosure are merely for reference, do not limit the elements to a particular orientation, and are generally interchangeable throughout. For example, the upper phase power module 140 could be referred to a lower phase power module, a north phase power module, a south phase power module, a first phase power module, or a second phase power module.

Upper phase power module 140A may include point-of-use upper phase A controller 142A and upper phase A switches 144A. Upper phase A switches 144A may include one or more groups of switches. As shown in FIG. 5, upper phase A switches 144A may include upper phase A north switches 144A-N and upper phase A south switches 144A-S.

Point-of-use upper phase A controller 142A may include one or more memories, controllers, or sensors. For example, point-of-use upper phase A controller 142A may include a communication manager 405, a functional safety controller 410, a testing interface and controller 415, a north thermal sensor 420A, a south thermal sensor 420B, a self-test controller 425, a command manager 430, a waveform adjuster 435, a memory 440, north switches control and diagnostics controller 450N, and south switches control and diagnostics controller 450S. Point-of-use upper phase A controller 142A may include more or less components than those shown in FIG. 5. For example, point-of-use upper phase A controller 142A may include more or less than two switch control and diagnostics controllers, and may include more than two thermal sensors.

Communication manager 405 may control inter-controller communications to and from point-of-use upper phase A controller 142A and/or may control intra-controller communications between components of point-of-use upper phase A controller 142A. Functional safety controller 410 may control safety functions of point-of-use upper phase A controller 142A. Testing interface and controller 415 may control testing functions of point-of-use upper phase A controller 142A, such as end-of-line testing in manufacturing, for example. North thermal sensor 420A may sense a temperature at a first location in point-of-use upper phase A controller 142A, and south thermal sensor 420B may sense a temperature at a second location in point-of-use upper phase A controller 142A. Self-test controller 425 may control a self-test function of point-of-use upper phase A controller 142A, such as during an initialization of the point-of-use upper phase A controller 142A following a power on event of inverter 110, for example. Command manager 430 may control commands received from communication manager 405 issued to the north switches control and diagnostics controller 450N and south switches control and diagnostics controller 450S. Waveform adjuster 435 may control a waveform timing and shape of commands received from communication manager 405 issued to the north switches control and diagnostics controller 450N and south switches control and diagnostics controller 450S. Memory 440 may include one or more volatile and nonvolatile storage media for operation of point-of-use upper phase A controller 142A. North switches control and diagnostics controller 450N may send one or more signals to north switches 144A-N to control an operation of north switches 144A-N, and may receive one or more signals from north switches 144A-N that provide information about north switches 144A-N. South switches control and diagnostics controller 450S may send one or more signals to south switches 144A-S to control an operation of south switches 144A-S, and may receive one or more signals from south switches 144A-S that provide information about south switches 144A-S. As stated above, the terms north and south are merely used for reference, and north switches control and diagnostics controller 450N may send one or more signals to south switches 144A-S, and south switches control and diagnostics controller 450S may send one or more signals to south switches 144A-N.

Figure 6:
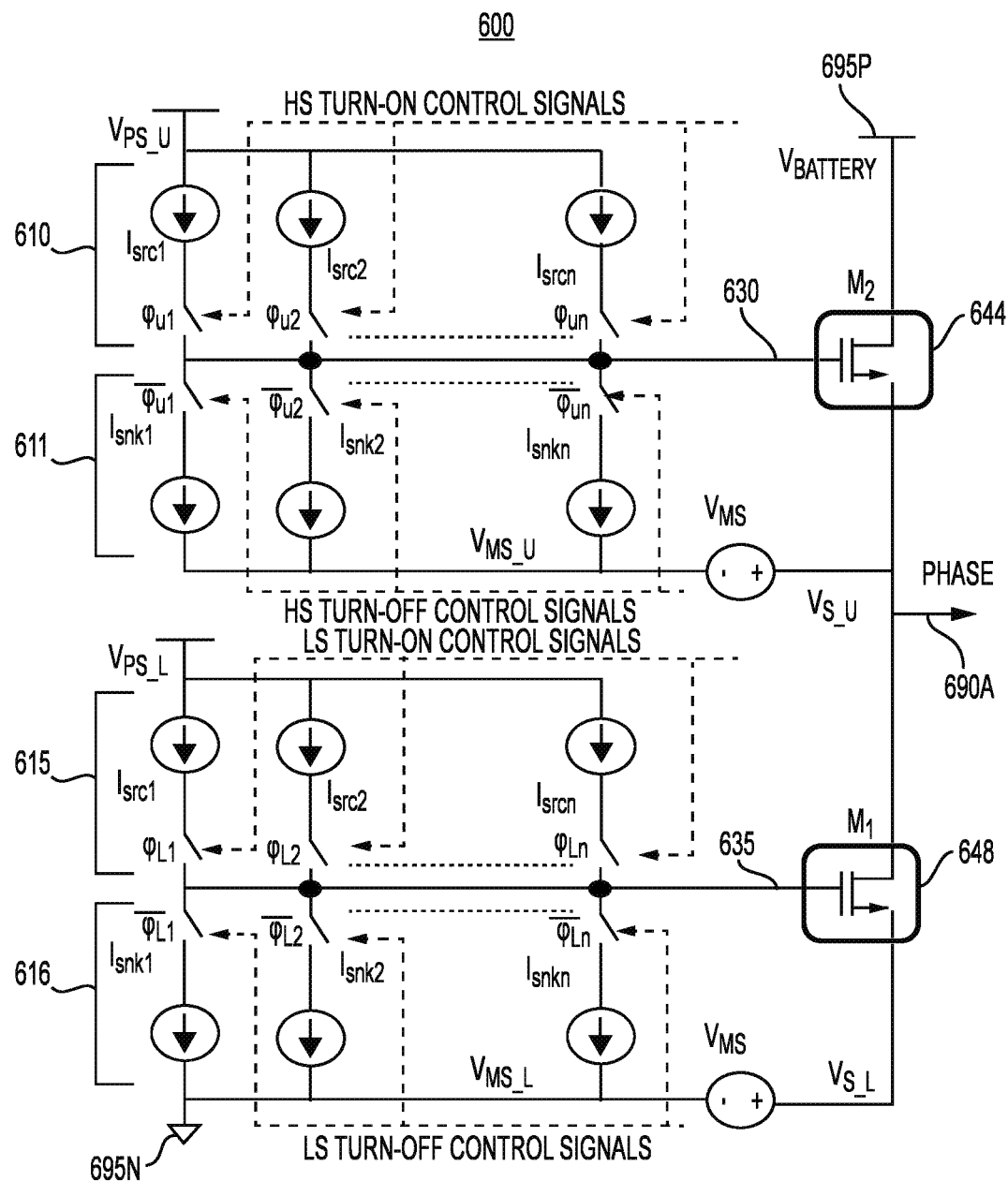
FIG. 6 depicts an exemplary system for a current-based adaptive gate driver for a power device switch, according to one or more embodiments.

FIG. 6 depicts an exemplary system for a current-based adaptive gate driver for a power device switch, according to one or more embodiments.

One or more embodiments may provide a gate driver system to significantly reduce switching power losses while protecting against concerns regarding the gate voltage and drain current ringing amplitude and the drain-to-source voltage over-shoot and ringing amplitude discussed above.

With reference to FIG. 2, for example, gate driver system 600 may be an implementation of upper phase power module 140 and lower phase power module 145. As shown in FIG. 6, upper phase power switch 644 (M2) may be connected to a positive terminal 695P of battery 195 and a phase terminal 690A (e.g. phase A) of motor 190, and lower phase power switch 648 (M1) may be connected to a negative terminal 695N of battery 195 and a phase terminal 690A of motor 190. For example, upper phase power switch 644 may be an implementation of one of upper phase switches 144 (e.g. upper phase A switches 144A), and lower phase power switch 648 may be an implementation of one of lower phase switches 148.

The gate terminal of lower phase power switch 648 may be driven, based on lower phase driving signal 635, with varying source current drivers 615 and varying sink gate current drivers 616. Isrc1 through Isrcn may be source current drivers 615 with varying values for the turn-on period, and Isnk1 through Isnkn may be sink current drivers 616 with varying values for the turn-off period of the lower phase power switch 648, respectively. Source current drivers 615 and sink gate current drivers 616 may be dynamically selected by operation of the respective φ switches based on the respective turn-on and turn-off control signals. The source current drivers 615 and sink gate current drivers 616 may be selected using sense and control methods, to be presented below, in order to drive the gate terminal of the lower phase power switch 648 to minimize the switching losses based on one or more of variation in intrinsic parameters of the lower phase power switch 648, parameter drift over the life of lower phase power switch 648, or operating temperature of lower phase power switch 648.

As shown in FIG. 6, both lower phase power switch 648 and upper phase power switch 644 may have an independent gate driver system. More specifically, the gate terminal of upper phase power switch 644 may be driven, based on upper phase driving signal 630, with varying source current drivers 610 and varying sink gate current drivers 611. Upper phase power switch 644 may include source current drivers 610 with varying values for the turn-on period, and sink current drivers 611 with varying values for the turn-off period of the upper phase power switch 644. Source current drivers 610 and sink gate current drivers 611 may be dynamically selected by operation of the respective φ switches based on the respective turn-on and turn-off control signals. The source current drivers 610 and sink gate current drivers 611 may be selected using sense and control methods, to be presented below, in order to drive the gate terminal of the upper phase power switch 644 to minimize the switching losses based on one or more of variation in intrinsic parameters of the upper phase power switch 644, parameter drift over the life of upper phase power switch 644, or operating temperature of upper phase power switch 644.

Figure 7:
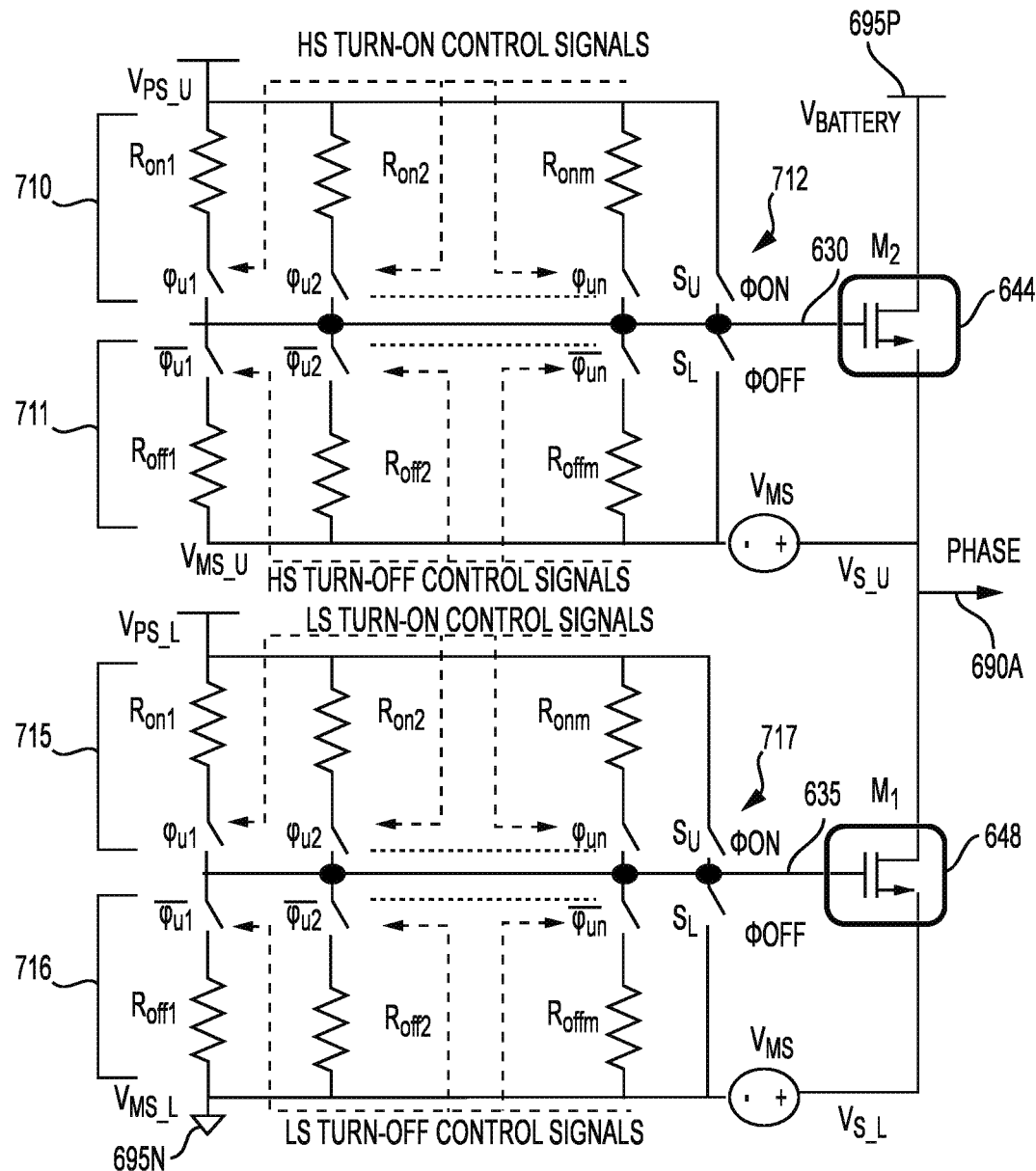
FIG. 7 depicts an exemplary system for a resistor-based adaptive gate driver for a power device switch, according to one or more embodiments.

FIG. 7 depicts an exemplary system for a resistor-based adaptive gate driver for a power device switch, according to one or more embodiments.

As shown in FIG. 7, gate driver system 700 may include turn-on and turn-off programmable profile resistors, in addition to or in place of the source and sink current drivers of gate driver system 600. Gate driver system 700 may provide persistent low impedance to the gate terminals of upper phase power switch 644 and lower phase power switch 648 during respective turn-on and turn-off events, and may provide maximum impunity to high strength electromagnetic corrupting fields.

The gate terminal of lower phase power switch 648 may be driven, based on lower phase driving signal 635, with varying turn-on resistors 715 and varying turn-off resistors 716. Ron1 through Ronm may be turn-on resistors 715 with varying values for the turn-on period, and Roff1 through Roffm may be turn-off resistors 716 with varying values for the turn-off period of the lower phase power switch 648, respectively. Turn-on resistors 715 and turn-off resistors 716 may be dynamically selected by operation of the respective φ switches based on the respective turn-on and turn-off control signals. The turn-on resistors 715 and turn-off resistors 716 may be selected using sense and control methods, to be presented below, in order to drive the gate terminal of the lower phase power switch 648 to minimize the switching losses based on one or more of variation in intrinsic parameters of the lower phase power switch 648, parameter drift over the life of lower phase power switch 648, or operating temperature of lower phase power switch 648.

As shown in FIG. 7, both lower phase power switch 648 and upper phase power switch 644 may have an independent gate driver system. More specifically, the gate terminal of lower phase power switch 648 may be driven, based on upper phase driving signal 635, with varying turn-on resistors 710 and varying turn-off resistors 711. Ron1 through Ronm may be turn-on resistors 710 with varying values for the turn-on period, and Roff1 through Roffm may be turn-off resistors 711 with varying values for the turn-off period of the upper phase power switch 644, respectively. Turn-on resistors 710 and turn-off resistors 711 may be dynamically selected by operation of the respective φ switches based on the respective turn-on and turn-off control signals. The turn-on resistors 710 and turn-off resistors 711 may be selected using sense and control methods, to be presented below, in order to drive the gate terminal of the upper phase power switch 644 to minimize the switching losses based on one or more of variation in intrinsic parameters of the upper phase power switch 644, parameter drift over the life of upper phase power switch 644, or operating temperature of upper phase power switch 644.

As shown in FIG. 7, the gate driver system 700 may also include upper phase clamp switches 712 (SU and SL), and lower phase clamp switches 717 (SU and SL). Upper phase clamp switches 712 and lower phase clamp switches 717 may play a crucial role in the switching loss reduction of the respective upper phase power switch 644 and lower phase power switch 648. The Rdson value of the clamp switches 712 and 717 are chosen to be many times lower than the respective minimum gate drive series resistance. Further description of the operation of upper phase clamp switches 712 and lower phase clamp switches 717 will be provided below.

Figure 8:
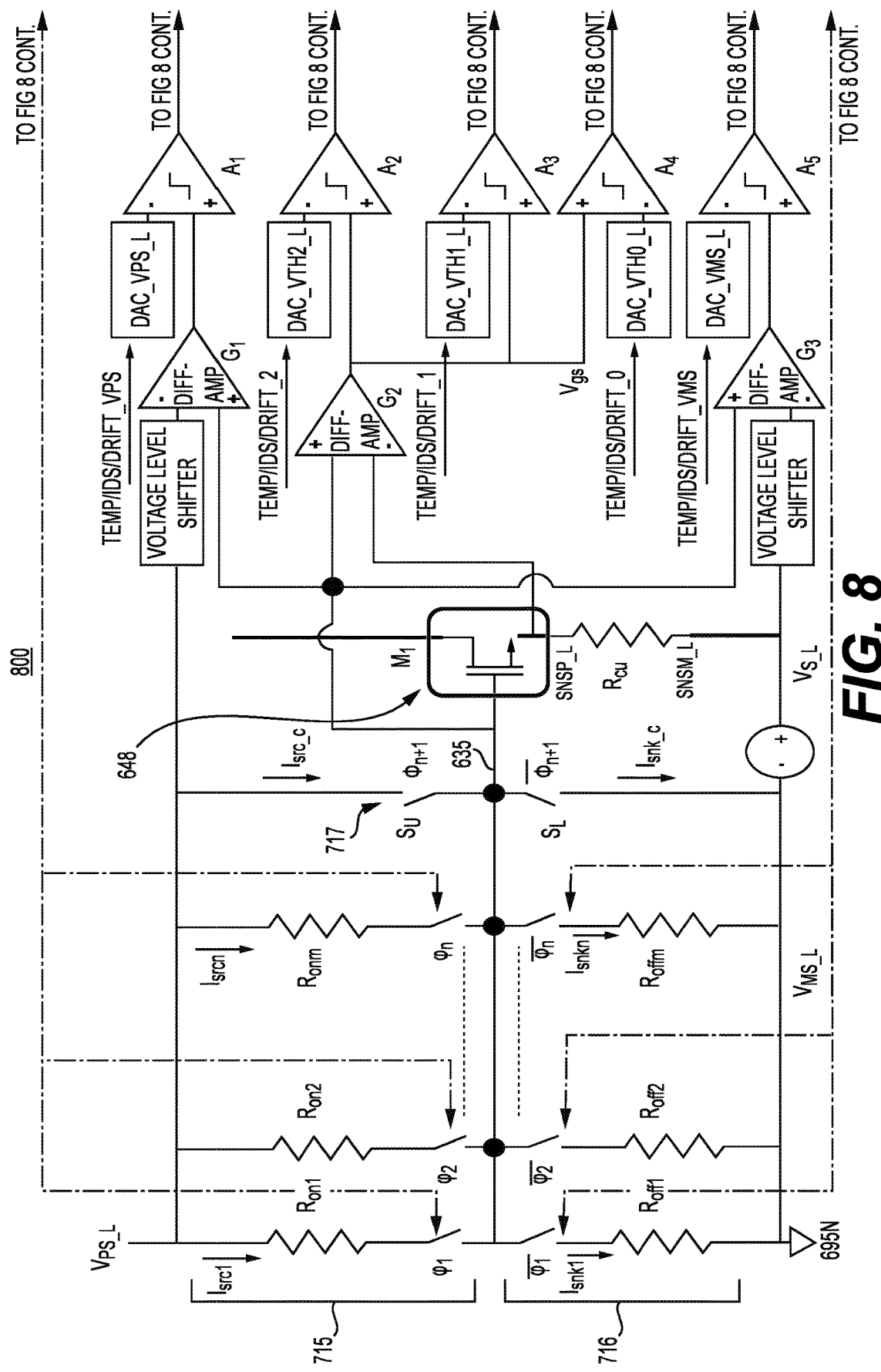
FIG. 8 depicts an exemplary system for a resistor-based adaptive gate driver with sensing and control for a power device switch, according to one or more embodiments.
Figure 8:
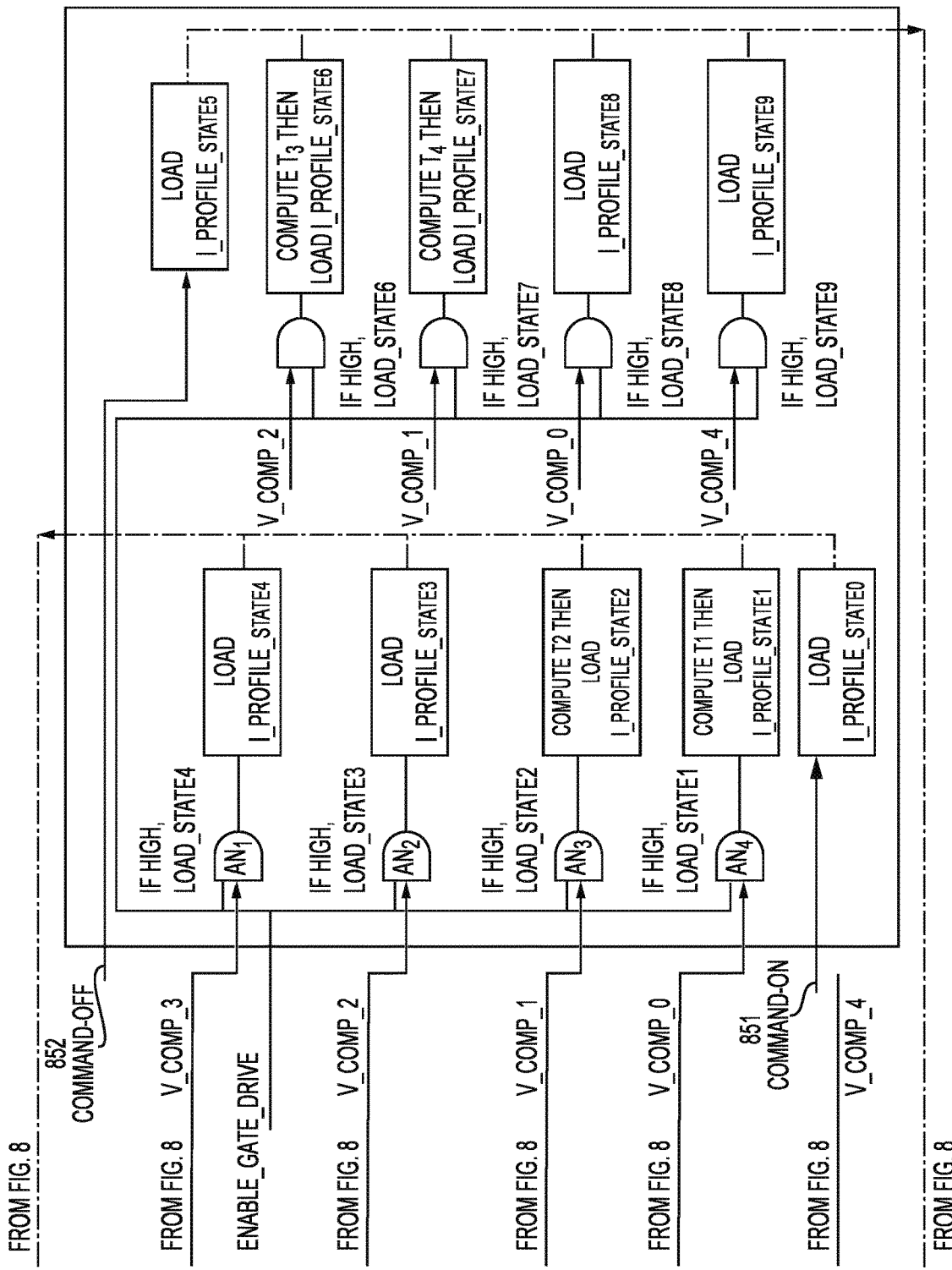
Figure 10:
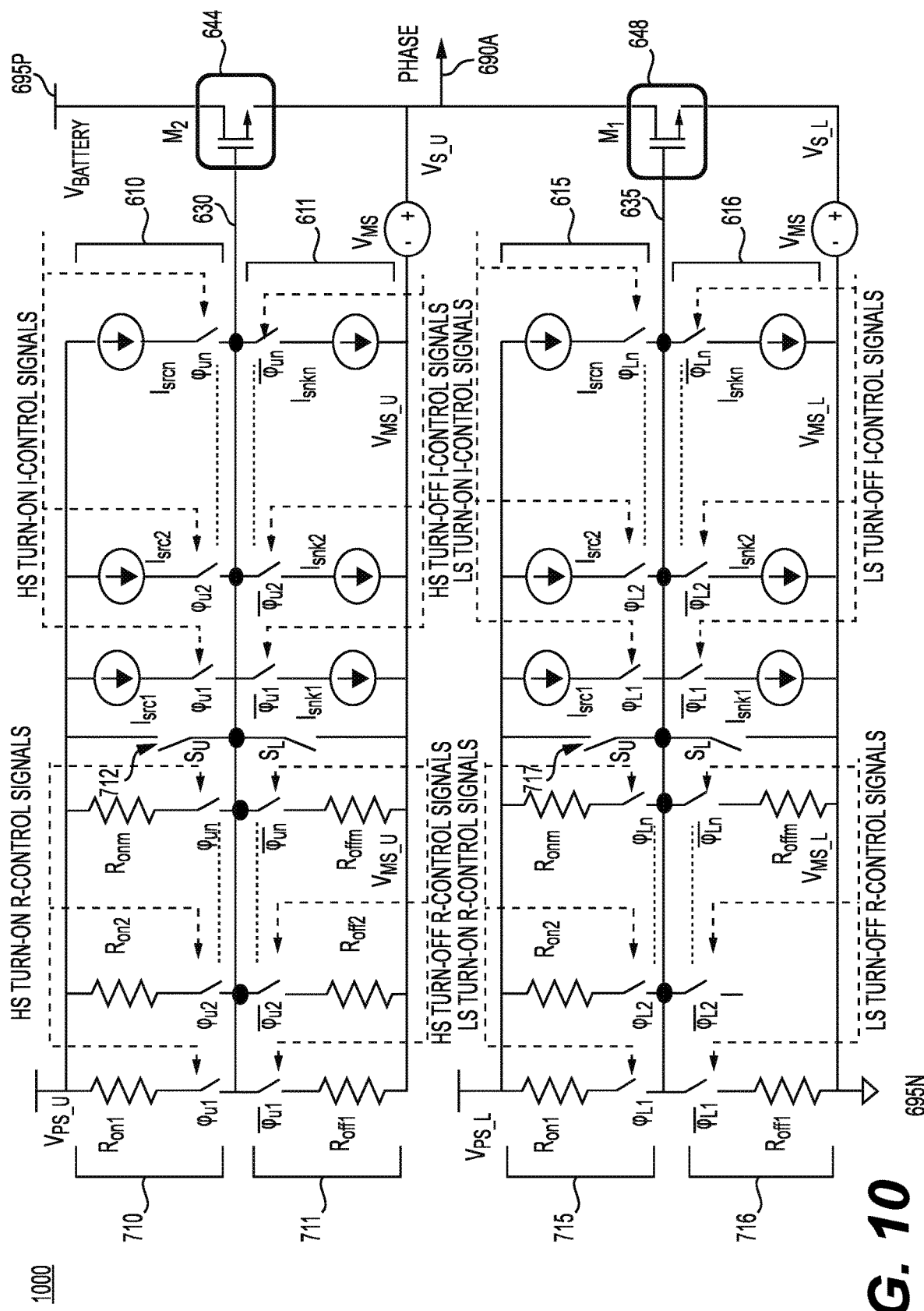
FIG. 10 depicts an exemplary system for a current/resistor hybrid adaptive gate driver for a power device switch, according to one or more embodiments.

FIG. 8 depicts an exemplary system for a resistor-based adaptive gate driver 800 with sensing and control for a power device switch, according to one or more embodiments. As shown in FIG. 8, differential amplifiers G1, G2, and G3 provide three different output signals to differential analog comparators A1, A2, A3, A4, and A5, which provide different output signals to AN1, AN2, AN3, and AN4 logic AND gates. The second input of the AN1, AN2, AN3, and AN4 logic AND gates are controlled by a group of logic signals named "Enable_Gate_Drive" signal, to load current profile signals, into a load register, for example, to sequentially activate each of the state0, state1, state2, state3, and state4 current profiles of Isrc1 through Isrcn gate sourcing currents (e.g. using turn-on resistors 715 and lower phase clamp switches 717 as shown, or using any of the gate driver configurations as shown in FIGS. 6, 7, and 10) to turn on lower phase power switch 648 with an unique computed gate turn-on profile. This current profile signals achieve minimum turn-on switching power loss while precisely controlling the gate-voltage ringing, drain-current ringing, and drain-to-source voltage overshoot and ringing to protect lower phase power switch 648 from experiencing any undue current and voltage stresses. Although FIG. 8 depicts the adaptive gate driver for lower phase power switch 648, the adaptive gate driver for upper phase power switch 644 may be similar to the adaptive gate driver for lower phase power switch 648.

The turn-on switching process may include various operations as described below.

The Command-ON signal 851 is first asserted to enable the "Enable_Gate_Drive" signal and load state0 programmed gate-current/drive profile. This facilitates several resistors (e.g. turn-on resistors 715), and/or in the case of a current driver, several current source units (e.g. source current drivers 615) to be connected to the gate terminal of lower phase power switch 648 to initiate a gate voltage rise of lower phase power switch 648. The G2 amplifier may continuously monitor the gate-to-source voltage of lower phase power switch 648.

The output of the G2 amplifier may next be fed to a first input of each of the comparators A2, A3, and A4, of which a second input of each is fed by outputs of three N-bit digital-to-analog converters (DACs) including DAC_VTH0_L, DAC_VTH1_L, and DAC_VTH2_L. The outputs of these DACs may be programmed to set any desired threshold voltage to the inputs of A2, A3, and A4 comparators, which may each perform a comparison using a respective output of the DACs. The threshold voltage of DAC_VTH2_L may be programmed to be higher than that of DAC_VTH1_L, which may be higher than that of DAC_VTH0_L. These threshold voltages may be required to be set before initiating the next gate-drive signal turn-on current profile.

As soon as the output of the G2 amplifier crosses the programmed threshold voltage set by the output of DAC_VTH0_L, the A4 output signal V_comp_0 is asserted high to AN4, and a programmed gate-current/resistor profile of I_profile_state1 (a stored value which is determined using the electrical models of the lower phase power switch 648, operating temperature, and last cycle load current value) is then loaded to steer the gate voltage to further rise according to I_profile_state1 with a sourcing time duration set to a pre-calculated time value of t1. The value "t1" may be a computed time duration for I_profile_state1, and may be used to detect a short or an open fault. If the monitored time is appreciably shorter than the computed value of t1, then an open fault exists. If the monitored time is appreciably longer than the computed value of t1, then a short fault exists. The equation to calculate t1 is: t1=[(Cgs+Cgd (at high value of Vds)·(Iload+Irmm)/(gfs·I_profile_state1)]·TCF·ICF. Here, gfs is the transconductance, Cgs and Cgd are the gate-to-source and gate-to-drain capacitances of lower phase power switch 648, Iload is load current flowing through lower phase power switch 648, Irmm is the reverse recovery peak current of the lower phase power switch 648 body diode, TCF is a temperature correction factor, and ICF is a computed load-current correction factor. The value of t1 may also be computed in advance and stored to be used for the I_profile_state1 turn-on timing and definition. Before the expiration of t1, the state of the A3 output signal V_comp_1 is first checked to assure a logic state is high. If the logic state of A3 output signal V_comp_1 is not high, then a fault has occurred. Alternatively or additionally, when an elapsed time from when I_profile_state1 has been loaded is longer than t1, a fault may be asserted. For the case of very low package stray values, corresponding t1 timing values may be computed to be used in monitoring t1 mission-mode timings. If the monitored t1 timings are outside the computed timings, then that indicates that a fault may have occurred. For this case, as soon as the state of the A3 output signal V_comp_1 becomes asserted high to AN3, the profile of I_profile_state2 is loaded which causes a further rise in the gate voltage.

Next, after the output of the G2 amplifier has crossed the programmed threshold voltage set by the output of DAC_VTH1_L, the A3 output signal V_comp_1 is asserted high to AN3, and a programmed gate current/resistor profile of I_profile_state2 (a stored value), is loaded to steer the gate voltage rise according to the I_profile_state2 value whose sourcing time duration is set to a pre-calculated time value of t2. The value 't2' may be a computed time duration for I_profile_state2, and may be used to detect a short or an open fault. If the monitored time is appreciably shorter than the computed value of t1, then an open fault exists. If the monitored time is appreciably longer than the computed value of t1, then a short fault exists. The equation to calculate t2 is: t2=[(Cgd(at low Vds)·(Vbattery+Vforward_bias_bodydiode−Iload·rdson/I_profile_state2)]·TCF·ICF. Before the expiration of t2, the state of the comparator A2 output signal V_comp_2 is first checked to assure a logic state is high. If the logic state of A2 output signal V_comp_2 is not high, then a fault has occurred. The value of t2 may also be computed in advance and stored to be used in the I_profile_state2 turn-on timing and definition. Again, for the case of very low package stray values, corresponding t2 timing values may be computed to be used in monitoring t2 mission-mode timings. If the monitored t2 timings are outside the computed timings, then that indicates that a fault may have occurred. For this case, as soon as the state of the A2 output signal V_comp_2 becomes asserted high to AN2, the profile of I_profile_state3 is loaded which causes a further rise in the gate voltage.

Next, when the state of the comparator A2 output signal V_comp_2 becomes logic high to AN2, then a programmed gate current profile of I_profile_state3 (a stored value), is loaded to steer the gate voltage to further rise according to I_profile_state3.

As the gate voltage continues rising until the state of the comparator A1 output, V_comp_3, becomes logic high to AN1, then a programmed gate current/resistor profile of I_profile_state4 (a stored value), is loaded to steer the gate voltage to rise toward the positive supply of the gate-drive power supply. At this point, the turn-on profile process is complete and lower phase power switch 648 has become fully on. The role of G1 is to measure the differential voltage of VPS_U or VPS_L with respect to the upper phase driving signal 630 (voltage) or lower phase driving signal 635 (voltage). This measured voltage is used against DAC_VPS_U or DAC_VPS_L to determine when the I_Profile_State4 is to begin.

The turn-off process is initiated by asserting high the Command OFF signal 852, which in turn loads programmed gate current/resistor profile I_profile state5. This turns off (immediately after the falling edge of the PWL signal) the turn-on resistors 715 and/or source current drivers 615, and turns on several current sink (or resistor) units (e.g. turn-off resistors 716 and/or sink gate current drivers 616) connected to the gate terminal of lower phase power switch 648 to initiate lowering of the gate voltage. At the moment that the output of the G2 amplifier crosses the programmed threshold voltage set by the output of DAC_VTH2_L block, a programmed gate-current/resistor profile of I_profile_state6 (a stored value which is determined from the electrical models of lower phase power switch 648) is then loaded to steer the gate voltage to fall according to this current/resistor profile value whose sourcing time duration is set to a pre-calculated time value of t3. The digital input code values of DAC_VTH2_L block, for example, may be updated twice during each PWM period, with the first update occurring just before State_0 begins, and the second update occurring just before State_5 begins. The time zero values of the DAC values may be determined during an end-of line test of the inverter, stored, and used as initial codes with values to be re-computed with any changes in temperature and/or any change in the parameters of the power switches, load current amplitude and slope (see FIG. 9), or battery voltage, for example. These values may be computed for each PWM cycle period. The equation to calculate t3 is: t3=[Cgd(at low Vds·(Vbattery+Vforward_bias_bodydiode−Iload·rdson/I_profile_state6)]·TCF·ICF. Before the time t3 expires, the state of the A2 output signal V_comp_2 is first checked to assure a logic state is low. If the logic state of A2 output signal V_comp_2 is not low, then a fault has occurred. The value of t3 may also be obtained in advance and stored to be used in the state6 turn-off timing and definition. Again, for the case of very low package stray values, corresponding t3 timing values may be computed to be used in monitoring t3 mission-mode timings. If the monitored t3 timings are outside the computed timings, then that indicates that a fault may have occurred.

Next, based on an output of the G2 amplifier crossing the programmed threshold voltage set by the output of DAC_VTH1_L block, a programmed gate-current/resistor profile of I_profile_state7 (a stored value), is loaded to steer the gate voltage to further fall according to this current/resistor profile value whose sourcing time duration is set to a pre-calculated time value of t4. The equation to calculate t4 is: t4=[(Cgs+Cgd(at low Vds))·(Iload)/(gfs·I_profile_state7)]·TCF·ICF. Before the expiration of t4, the state of the comparator A3 output signal V_comp_1 is first checked to assure a logic state has gone low, If the logic state of A3 output signal V_comp_1 is not low, then a fault has occurred. The value of t4 may also be determined in advance and stored to be used in the state7 turn-off timing and definition. Again, for the case of very low package stray values, corresponding t4 timing values may be computed to be used in monitoring t4 mission-mode timings. If the monitored t4 timings are outside the computed timings, then that indicates that a fault may have occurred. For this case as soon as the state of the A3 output signal V_comp_1 becomes asserted low, the profile of I_profile_state7 is loaded causing the gate voltage to fall further.

Next, when the state of the comparator A4 output, V_comp_0, becomes low, then programmed gate-current profile of I_profile_state8 (a stored value), is loaded to steer the gate voltage to fall according to this current/resistor profile value. The gate voltage keeps falling until the state of the comparator A5 output, V_comp_4, becomes logic low, then programmed gate-current/resistor profile of I_profile_state9 (a stored value), is subsequently loaded to steer the gate voltage to further fall toward the negative supply voltage rail of the gate-drive power supply voltage. The role of G3 (Vg-VMS) may be to operate so that when the amplitude of the differential amplifier G3 crosses the programmed threshold voltage value of "DAC_VMS_L", then the off-state goes to the next assigned state, a maintenance state, and a few clock cycles after entering the maintenance state, the SL clamping switch may be commanded on. At this point, the turn-off profile process is complete and lower phase power switch 648 has become fully turned off.

The calculations of gate current/resistor turn-on and turn-off profiles (Iprofile) may be provided as: Iprofile=Inom_prog_value·[Tref/(273+αTC·T)]·βIds, where Tref is the reference temperature (such as room temperature, for example), αTC is a stored fixed pre-determined value representing a suitable temperature coefficient factor, and T is the operating temperature. The stored nominal current profiles (Inom_prog_value) is computed at the module level such that the nominal current profile accounts for the parameter variations of all power switches in the module, and uses the measured value of the power FET parameters Vth, gfs and Rdson at a given temperature (such as at Tref, for example). The two multiplying correction factors in above account for the temperature variation (the terms in the bracket) and the current-profile-slope-correction factor of βIds, which further modifies Iprofile to minimize the switching power losses with the current flowing in the power FET devices. The device current correction factor, βIds, is calculated during each PWM switching cycle for the calculation of βIds, which is in turn used to compute Iprofile for the next PWM cycle.

With reference to lower phase power switch 648 of FIG. 7, switch SU of lower phase clamp switches 717 may be turned on when the output V_Comp_3 of A1 comparator of FIG. 8 takes a high state, forcing the gate terminal voltage to positive supply value of the gate-drive power supply in a shortest amount of time, thus minimizing the total power FET losses. Furthermore, switch SL of lower phase clamp switches 717 may be turned on when the output V_Comp_4 of A5 comparator takes a high state, forcing the gate terminal voltage to negative supply value of the gate-drive power supply in a shortest amount time, thus minimizing the total power FET losses. State 4 may be a maintenance state, which is initiated when the gate potential is approaching toward VPS_U or VPS_L voltage. SU clamping switch turns on a few clock cycles after the turn-on gate drive enters State_4, and SL clamping switch turns on a few clock cycles after entering State 9. SU clamping switch opens immediately after the falling edge of PWL signal.

Figure 9:
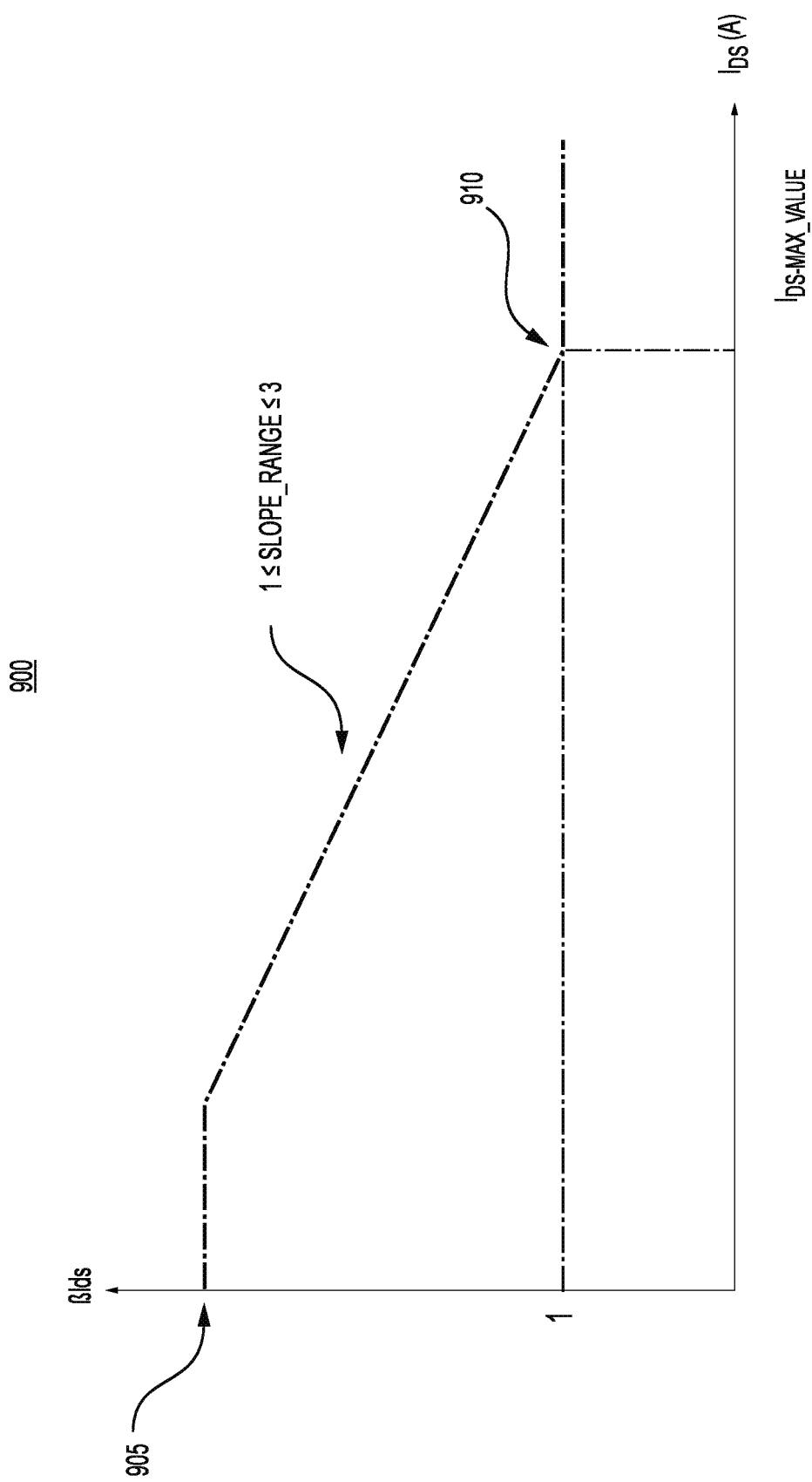
FIG. 9 depicts an exemplary plot for a correction factor for an adaptive gate driver for a power device switch, according to one or more embodiments.

FIG. 9 depicts an exemplary plot for a correction factor for an adaptive gate driver for a power device switch, according to one or more embodiments.

FIG. 9 shows a trajectory plot 900 of the βIds correction factor. βIds may be computed for each PWM cycle period based on the previous measurement of Ids magnitude and slope. As shown in FIG. 9, βIds current-profile-slope-correction factor 905 may begin at a maximum value as Ids increases from zero, decrease in value along a slope ranging from approximately three to approximately one as Ids increases, and reach a minimum value of one at 910 at a maximum value of Ids. The two multiplying correction factors in Iprofile equation account for the temperature variation (the terms in the bracket) and the current-profile-slope-correction factor of βIds, which further modifies Iprofile to minimize the switching power losses with the current flowing in the power FET devices. The device current is calculated during each PWM switching cycle for the calculation of βIds, which is in turn used to compute Iprofile for the next PWM cycle.

FIG. 10 depicts an exemplary system for a current/resistor hybrid adaptive gate driver for a power device switch, according to one or more embodiments.

One or more embodiments may include a hybrid adaptive gate driver 1000 including both turn-on and turn-off (source/sink) programmable profile current drivers and turn-on and turn-off programmable profile resistors. Hybrid adaptive gate driver 1000 may provide both low impedance to the gate terminals of upper phase power switch 644 and lower phase power switch 648 during turn-on and turn-off events while maintaining the capability to drive a gate with any desired current drive profile. The infrastructure of the gate-drive technique may include a high-speed measurement of the current flowing into upper phase power switch 644 and lower phase power switch 648, to be used to turn off the upper phase power switch 644 and lower phase power switch 648 in an overcurrent event in less than one microsecond.

Lower phase power switch 648, for example, may include multiple devices in parallel to deliver a maximum requested power transfer to the load. Due to the device parameter mismatches from the non-ideal manufacturing process of the power FETs, the load current may not be equally shared among the parallel devices during both switching and conduction operations. However, one or more embodiments may separately drive the gate terminal of each device or a group of devices. This separate driving may offer the opportunity to schedule the turn-on and turn-off timings and calculated gate current profiles to minimize current imbalance in the parallel devices. For example, in the case when two devices are connected in parallel, if one device (or a group of parallel connected devices) has higher threshold voltage than a second device, the turn-on of the devices with a lower threshold voltage may be delayed with the respect to the turn-on time of the device with a higher threshold voltage, resulting in relatively equal current amplitude flowing in both devices. During the turn-off, the device with higher threshold voltage may be the device with delayed turn-off timing, contrary to the turn-on event delay. This separate driving may provide uniform and relatively equal temperature and relatively matched long-term longevity among the parallel devices.

In addition to introducing a turn-on/off delay between unmatched groups of devices, unique gate-drive profile may be computed to further equalize and improve current sharing among groups of devices. One or more embodiments may minimize the current imbalance among the parallel-connected devices by prioritizing the turn-on and turn-off delay timings and computing appropriate gate-drive profiles among the devices.

Figure 11:
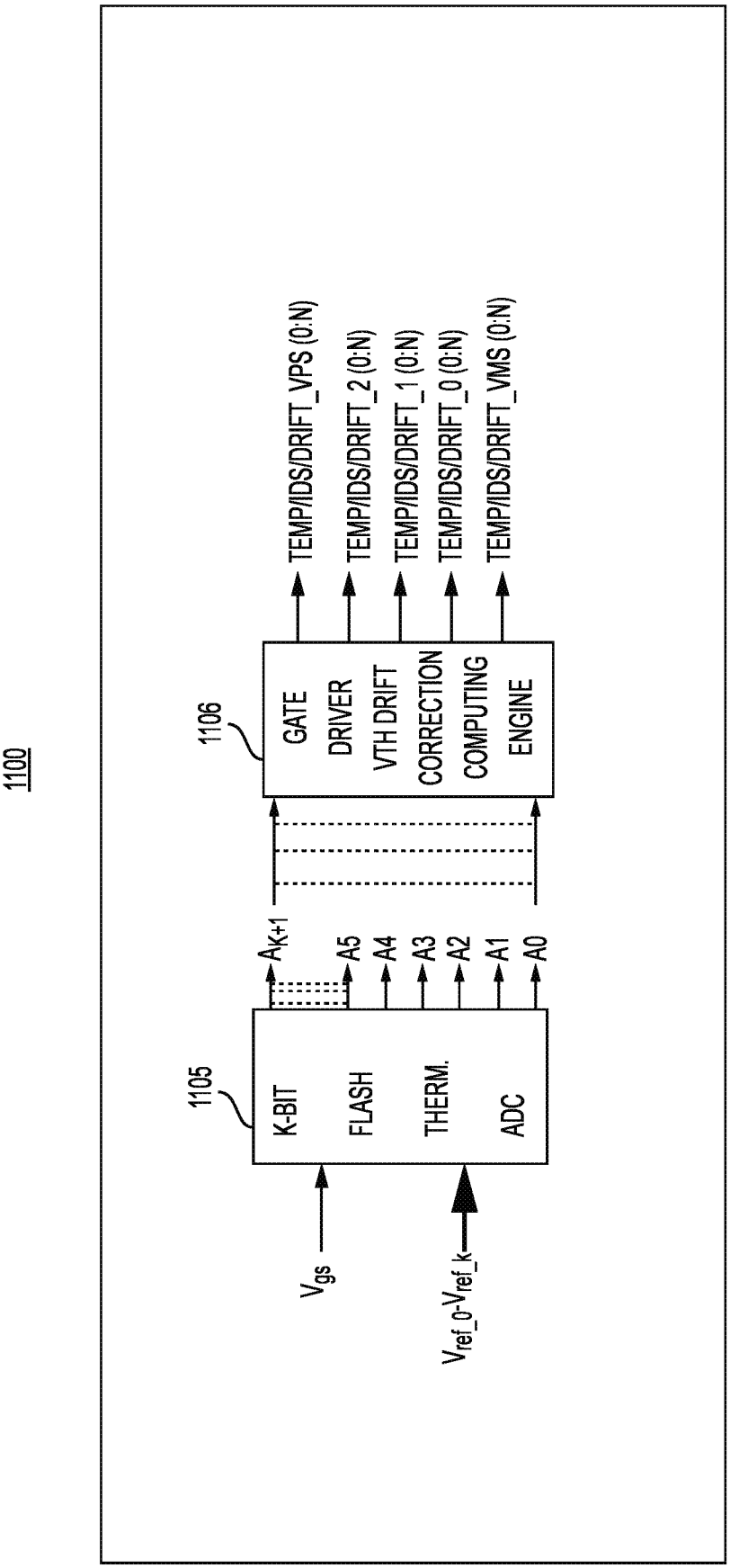
FIG. 11 depicts an exemplary system for a correction controller for an adaptive gate driver for a power device switch, according to one or more embodiments.

FIG. 11 depicts an exemplary system for a correction controller 1100 for an adaptive gate driver for a power device switch, according to one or more embodiments.

With reference to FIG. 8, one or more embodiments may continuously measure threshold voltage drift of a power switch over time. As shown in FIG. 11, this may be achieved by continuously measuring the gate-to-source voltage Vgs of the power switches with a high speed sensing circuit, to be converted into a digital code A0-A(k−1), by a flash analog-to-digital converter 1105. The digital code may be used by a drift-correction-computing-engine 1106 to compute an optimum and/or safe gate drive turn-on and/or turn-off voltage profile, or, in an extreme case, to clear an open gate-terminal fault, for example.

Figure 12:
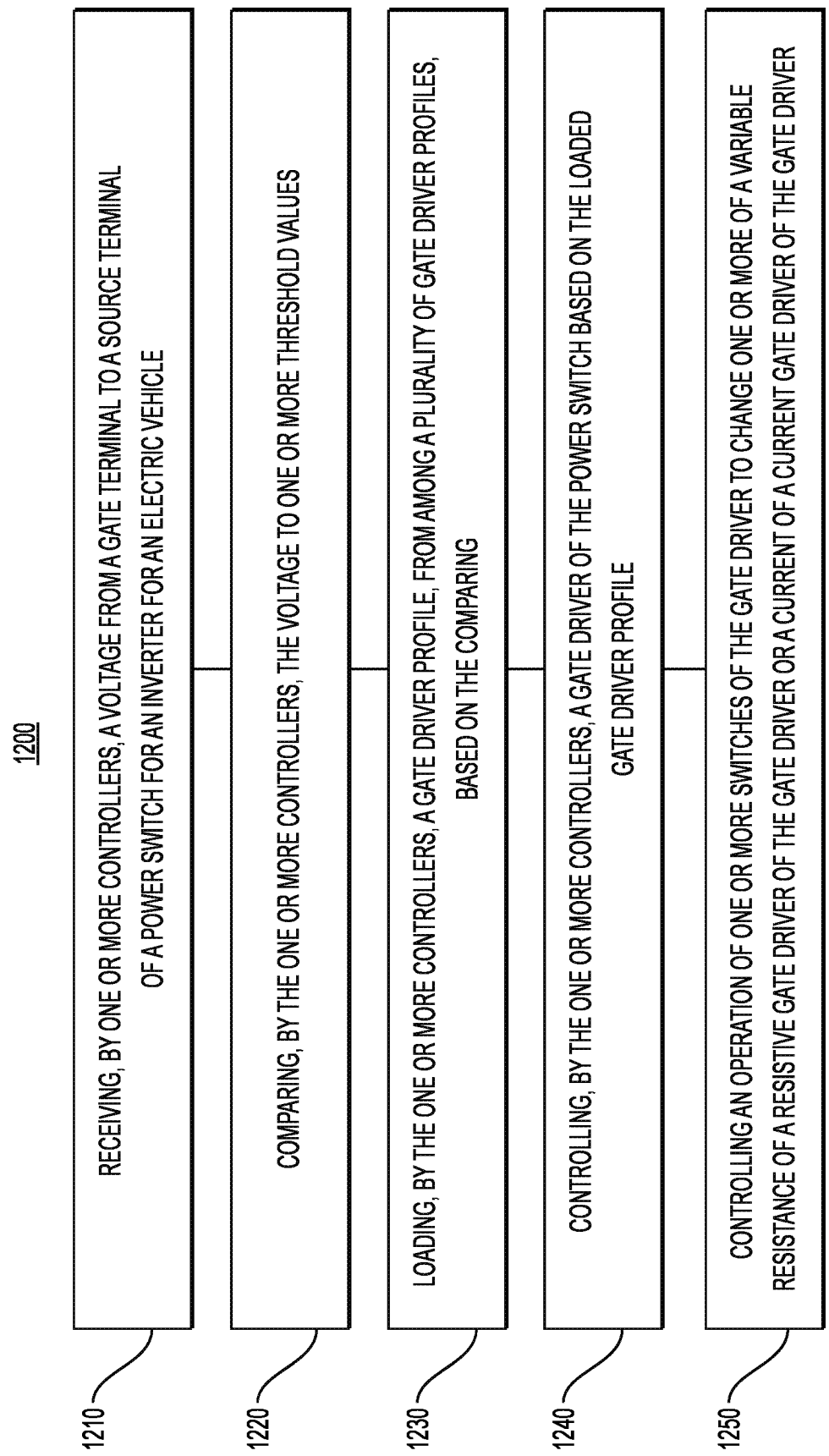
FIG. 12 depicts an exemplary method for operating an adaptive gate driver for a power device switch, according to one or more embodiments.

FIG. 12 depicts an exemplary method 1200 for operating an adaptive gate driver for a power device switch, according to one or more embodiments.

Method 1200 may include receiving, by one or more controllers (e.g. point-of-use upper phase A controller 142A or resistor-based adaptive gate driver 800 for lower phase power switch 648), a voltage from a gate terminal to a source terminal of a power switch (e.g. upper phase A switches 144A or lower phase power switch 648) for an inverter 110 for an electric vehicle 100 (operation 1210). Method 1200 may include comparing, by the one or more controllers, the voltage to one or more threshold values (e.g. DAC_VTH0_L, DAC_VTH1_L, or DAC_VTH2_L) (operation 1220). Method 1200 may include loading, by the one or more controllers, a gate driver profile (e.g. I_profile_state1), from among a plurality of gate driver profiles, based on the comparing (operation 1230). Method 1200 may include controlling, by the one or more controllers, a gate driver of the power switch based on the loaded gate driver profile (operation 1240). Method 1200 may include controlling an operation of one or more switches of the gate driver to change one or more of a variable resistance of a resistive gate driver of the gate driver or a current of a current gate driver of the gate driver (operation 1250). For example, turn-on resistors 710 and turn-off resistors 711 may be dynamically selected by operation of the respective φ switches based on the respective turn-on and turn-off control signals of the loaded gate driver profile. The gate driver profile may be determined based on one or more of an intrinsic characteristic of the power switch, load-current slope and amplitude value, high-voltage battery amplitude of the inverter, or operating temperature of the power switch.

One or more embodiments may provide a gate driver system that significantly reduces switching power losses while protecting the power switches with regard to the gate voltage and drain current ringing amplitude and the drain to source voltage overshoot and ringing amplitude. One or more embodiments may provide a gate driver system that computes optimum gate-drive turn-on and turn-off voltage profiles that incorporates intrinsic characteristics of power devices, load-current slope and amplitude, high-voltage battery amplitude, and operating temperature. One or more embodiments may provide a gate driver system that continuously measures threshold voltage drift over time of a power device, which may be used in the computation of the optimum gate-drive turn-on and turn-off voltage profiles, and in the detection of an open gate terminal fault. One or more embodiments may provide a gate driver system that uses a hybrid variable resistive driver along with fast transition switch-mode circuit, featuring a very low driving impedance for minimizing the switching turn-on and turn-off current and/or voltage ringing, while shortening the transition time to the full conduction time window. One or more embodiments may provide a gate driver system that continuously detects hard and/or soft short and/or open faults throughout the switching turn-on, turn-off, and conduction periods by continuously checking the gate voltage amplitude and rate of change of the gate voltage over time against several threshold voltages and pre-programmed time windows. One or more embodiments may provide a gate driver system that, for the case of turning on into hard short, computes a special turn-off profile to assure a safe turn-off of the power switch.

Other embodiments of the disclosure will be apparent to those skilled in the art from consideration of the specification and practice of the invention disclosed herein. It is intended that the specification and examples be considered as exemplary only, with a true scope and spirit of the invention being indicated by the following claims.

What is claimed is:
1. A system comprising:
an inverter configured to convert DC power from a battery to AC power to drive a motor, wherein the inverter includes:
a power switch including a drain terminal, a source terminal, and a gate terminal;
a gate driver configured to provide a signal to the gate terminal, the gate driver including one or more of a resistive gate driver with variable resistance or a current gate driver with variable current; and
one or more controllers configured to detect a voltage from the gate terminal to the source terminal of the power switch, and control the gate driver based on the detected voltage.

2. The system of claim 1, wherein the one or more controllers includes one or more point-of-use controllers on a power module with the power switch.

3. The system of claim 1, wherein the drain terminal of the power switch is configured to be connected to a positive terminal of the battery, and the source terminal of the power switch is configured to be connected to a phase terminal of the motor.

4. The system of claim 1, wherein the source terminal of the power switch is configured to be connected to a negative terminal of the battery, and the drain terminal of the power switch is configured to be connected to a phase terminal of the motor.

5. The system of claim 1,
wherein the resistive gate driver with variable resistance includes one or more resistors in series with one or more switches, wherein each resistor of the one or more resistors is in series with each switch of the one or more switches, and
wherein the one or more controllers is configured to control the gate driver by controlling the resistive gate driver by operating the one or more switches to change the variable resistance of the resistive gate driver.

6. The system of claim 5, wherein the resistive gate driver further includes a clamp switch to bypass the one or more resistors in series with one or more switches.

7. The system of claim 1,
wherein the current gate driver with variable current includes one or more current drivers in series with one or more switches, wherein each current driver of the one or more current drivers is in series with each switch of the one or more switches, and
wherein the one or more controllers is configured to control the gate driver by controlling the current gate driver by operating the one or more switches to change the current of the current gate driver.

8. The system of claim 1, wherein the one or more controllers is configured to:
perform a comparison of the detected voltage to one or more threshold values,
load a gate driver profile, from among a plurality of gate driver profiles, based on the comparison, and
control the gate driver based on the loaded gate driver profile.

9. The system of claim 1, wherein the gate driver includes both of the resistive gate driver with variable resistance and the current gate driver with variable current.

10. The system of claim 1, further comprising:
the battery configured to supply the DC power to the inverter; and
the motor configured to receive the AC power from the inverter to drive the motor.

11. A system including:
a power module for an inverter for an electric vehicle, the power module comprising:
a power switch including a drain terminal, a source terminal, and a gate terminal;

a gate driver configured to provide a signal to the gate terminal, the gate driver including one or more of a resistive gate driver with variable resistance or a current gate driver with variable current; and one or more point-of-use controllers configured to detect a voltage from the gate terminal to the source terminal of the power switch, and control the gate driver based on the detected voltage.

12. The system of claim 11, wherein the resistive gate driver with variable resistance includes one or more resistors in series with one or more switches, wherein each resistor of the one or more resistors is in series with each switch of the one or more switches, and wherein the one or more point-of-use controllers is configured to control the gate driver by controlling the resistive gate driver by operating the one or more switches to change the variable resistance of the resistive gate driver.

13. The system of claim 12, wherein the resistive gate driver further includes a clamp switch to bypass the one or more resistors in series with one or more switches.

14. The system of claim 11, wherein the current gate driver with variable current includes one or more current drivers in series with one or more switches, wherein each current driver of the one or more current drivers is in series with each switch of the one or more switches, and wherein the one or more point-of-use controllers is configured to control the gate driver by controlling the current gate driver by operating the one or more switches to change the current of the current gate driver.

15. The system of claim 11, wherein the one or more point-of-use controllers is configured to:

perform a comparison of the detected voltage to one or more threshold values, load a gate driver profile, from among a plurality of gate driver profiles, based on the comparison, and control the gate driver based on the loaded gate driver profile.

16. The system of claim 15, wherein the gate driver profile is determined based on one or more of an intrinsic characteristic of the power switch, load-current slope and amplitude value, high-voltage battery amplitude of the inverter, or operating temperature of the power switch.

17. The system of claim 11, wherein the gate driver includes both of the resistive gate driver with variable resistance and the current gate driver with variable current.

18. A method comprising:

receiving, by one or more controllers, a voltage from a gate terminal to a source terminal of a power switch for an inverter for an electric vehicle;

comparing, by the one or more controllers, the voltage to one or more threshold values;

loading, by the one or more controllers, a gate driver profile, from among a plurality of gate driver profiles, based on the comparing; and controlling, by the one or more controllers, a gate driver of the power switch based on the loaded gate driver profile.

19. The method of claim 18, wherein the controlling the gate driver includes:

controlling an operation of one or more switches of the gate driver to change one or more of a variable resistance of a resistive gate driver of the gate driver or a current of a current gate driver of the gate driver.

20. The method of claim 18, wherein the gate driver profile is determined based on one or more of an intrinsic characteristic of the power switch, load-current slope and amplitude value, high-voltage battery amplitude of the inverter, or operating temperature of the power switch.

* * * * *